US008775983B1

(12) United States Patent
Wang

(10) Patent No.: US 8,775,983 B1
(45) Date of Patent: Jul. 8, 2014

(54) LAYOUT FIXING GUIDELINE SYSTEM FOR DOUBLE PATTERNING ODD CYCLE VIOLATIONS

(71) Applicant: Cadence Design Systems, Inc., San Jose, CA (US)

(72) Inventor: Xiaojun Wang, Cary, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/725,914

(22) Filed: Dec. 21, 2012

(51) Int. Cl.
G06F 17/50 (2006.01)

(52) U.S. Cl.
USPC .................... 716/54; 716/52; 716/53; 716/55

(58) Field of Classification Search
USPC ...................................... 716/52–55
See application file for complete search history.

(56) References Cited

U.S. PATENT DOCUMENTS

| 6,446,239 | B1 | 9/2002 | Markosian et al. | |
|---|---|---|---|---|
| 8,209,656 | B1* | 6/2012 | Wang et al. | 716/139 |
| 8,434,043 | B1 | 4/2013 | Hsu et al. | |
| 8,448,100 | B1 | 5/2013 | Lin et al. | |
| 8,473,874 | B1 | 6/2013 | Sharma et al. | |
| 8,516,402 | B1* | 8/2013 | Wang | 716/52 |
| 2010/0153905 | A1* | 6/2010 | Maeda | 716/21 |
| 2011/0078638 | A1 | 3/2011 | Kahng et al. | |
| 2011/0193234 | A1* | 8/2011 | Chen et al. | 257/773 |
| 2011/0197168 | A1 | 8/2011 | Chen et al. | |
| 2011/0219341 | A1 | 9/2011 | Cao et al. | |
| 2011/0296360 | A1* | 12/2011 | Wang et al. | 716/106 |
| 2012/0124536 | A1 | 5/2012 | Sharma | |
| 2012/0216157 | A1 | 8/2012 | Luo et al. | |
| 2013/0024822 | A1 | 1/2013 | Hsieh et al. | |
| 2013/0061186 | A1 | 3/2013 | Hsu et al. | |

OTHER PUBLICATIONS

U.S. Appl. No. 13/555,058, filed Jul. 20, 2012, Wang, Xiaojun.
Portions of prosecutions history of U.S. Appl. No. 12/948,755, Mar. 4, 2013, Sharma, Karun.
Portions of prosecutions history of U.S. Appl. No. 13/215,113, May 31, 2013, Sharma, Karun, et al.
Portions of prosecutions history of U.S. Appl. No. 13/555,058, Oct. 18, 2013, Wang, Xiaojun.

* cited by examiner

*Primary Examiner* — Naum Levin
(74) *Attorney, Agent, or Firm* — Vista IP Law Group, LLP

(57) ABSTRACT

Some embodiments of the invention provide a method for identifying and displaying odd loops and hints for resolution of the odd loops in an IC design layout for printing on multiple masks. The method of some embodiments identifies the hints by evaluating the effectiveness and feasibility of different potential resolutions, ensuring that hints do not create additional odd loops. The method of some embodiments also displays indications of the odd loops and the hints which a user can use to troubleshoot an odd loop violation. The method of some embodiments also prioritizes or scores the resolution hints to facilitate efficient troubleshooting of odd loop violations.

18 Claims, 28 Drawing Sheets

LAYOUT FIXING GUIDELINE SYSTEM FOR DOUBLE PATTERNING ODD CYCLE VIOLATIONS

BACKGROUND

An integrated circuit ("IC") is a device (e.g., a semiconductor device) or electronic system that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect the IC's electronic and circuit components.

Design engineers design ICs by transforming logical or circuit descriptions of the ICs' components into geometric descriptions, called design layouts. Design layouts typically include (1) circuit modules (i.e., geometric representations of electronic or circuit IC components) with pins and (2) interconnect lines (i.e., geometric representations of wiring) that connect the pins of the circuit modules. In this fashion, design layouts often describe the behavioral, architectural, functional, and structural attributes of the IC. To create design layouts, design engineers typically use electronic design automation ("EDA") applications. These applications provide sets of computer-based tools for creating, editing, analyzing, and verifying design layouts. The applications also render the layouts on a display device or to storage for displaying later.

Fabrication foundries ("fabs") manufacture ICs based on the design layouts using a photolithographic process. Photolithography is an optical printing and fabrication process by which patterns on a photolithographic mask (i.e., "photomask," or "mask") are imaged and defined onto a photosensitive layer coating a substrate. To fabricate an IC, photomasks are created using the IC design layout as a template. The photomasks contain the various geometries or shapes (i.e., features) of the IC design layout. The various geometries or shapes contained on the photomasks correspond to the various base physical IC elements that comprise functional circuit components such as transistors, interconnect wiring, vertical interconnect access (via) pads, as well as other elements that are not functional circuit elements but are used to facilitate, enhance, or track various manufacturing processes. Through sequential use of the various photomasks corresponding to a given IC in an IC fabrication process, a large number of material layers of various shapes and thicknesses with various conductive and insulating properties may be built up to form the overall IC and the circuits within the IC design layout.

As more circuit features are packed into an IC design layout (e.g., manufacturing processes at feature sizes of 22 nm and below), the resolution of the photolithographic process makes it extremely difficult to fabricate the geometries or shapes on a single lithography mask. The difficulty stems from constraining factors in traditional photolithographic processes that limit the effectiveness of current photolithographic processes. Some such constraining factors are the lights/optics used within the photolithographic processing systems. Specifically, the lights/optics are band limited due to physical limitations (e.g., wavelength and aperture) of the photolithographic process. Therefore, the photolithographic process cannot print beyond a certain minimum width of a feature, minimum spacing between features, and other such physical manufacturing constraints.

For a particular layer of the IC fabrication process, the pitch specifies the sum of the width of a feature and the space on one side of the feature separating that feature from a neighboring feature on the same layer. The minimum pitch for a layer is the sum of the minimum feature width and the minimum spacing between features on the same layer. Depending on the photolithographic process at issue, factors such as optics and wavelengths of light or radiation restrict how small the pitch may be made before features can no longer be reliably printed to a wafer or mask. As such, the smallest size of any features that can be created on a layer of an IC is limited by the minimum pitch for the layer.

FIG. 1 illustrates a typical pitch constraint of a photolithographic process. In FIG. 1, a pitch 110 acts to constrain the spacing between printable features 120 and 130 of a design layout. While other photolithographic process factors such as the threshold 140 can be used to narrow the width 150 of the features 120 and 130, such adjustments do not result in increased feature density without adjustments to the pitch 110. As a result, increasing feature densities beyond a certain threshold is infeasible via a pitch constrained single exposure process.

To enhance the feature density, the shapes on a single layer can be manufactured on two different photolithographic masks. This approach is often referred to as "Double Patterning Lithography (DPL)" technology. FIG. 2 illustrates an example of this approach. In FIG. 2, a design layout 205 specifies three features 210-230 that are pitch constrained and therefore cannot be photolithographically printed with a conventional single exposure process. Analysis of the characteristics (e.g., the band limitation) of the available photolithographic process and of the design layout 205 results in the decomposition of the design layout 205 into a first exposure 240 for printing features 210 and 230 and a second exposure 250 for printing feature 220. As such, the features 210 and 230 are assigned to a first photomask for printing during the first exposure 240 and feature 220 is assigned to a second photomask for printing during the second exposure 250.

FIG. 3 illustrates sending five shapes 301-305 of a design layout 300 to two different masks. The shape pairs of the shapes 301 and 302; the shapes 302 and 303; the shapes 303 and 304; and the shapes 303 and 305 are all pitch constrained. Therefore, the two shapes of each pair must be sent to two different masks 310 and 315. Accordingly, the shapes 301 and 303 are sent to a first mask 310. That is, the shapes 301 and 303 are printed during a first exposure in order to produce contours 320. Similarly, the shapes 302, 304, and 305 are sent to a second mask 315. That is, the shapes 302, 304, and 305 are printed during a second exposure in order to produce contours 325. The resulting union of the contours 320 and 325 generates pattern 330 that is sufficient to approximately reproduce the original design layout 300.

When a gap exists between two shapes, meaning the two shapes are within the minimum same color spacing, the two shapes are considered connected. When shapes connect to form a loop and there are an odd number of shapes in the loop, it is not possible to assign colors in a way that all of the shapes are on a different mask from its neighbors. This error-causing loop will be referred to as an odd loop in this patent application.

FIG. 4 illustrates an example printing error that is materialized on the physical wafer when three shapes 1-3 in an odd loop are sent to two different masks. As shown, the shapes 1-3 are divided into two sets of shapes 410 and 415, where the shape 2 is sent to the first of the two masks and the shapes 1 and 3 are sent to the second mask.

Each set of shapes is printed during an exposure of a double exposure photolithographic printing process (e.g., a DPL process). That is, the set of shapes 410 (i.e., the shape 2) is printed during the first exposure in order to produce contours 420 and the set of shapes 415 is printed during the second exposure in order to produce contours 425.

However, because the shape 1 and the shape 3 were too close (e.g., within the minimum same color spacing 710) in the pattern 405, the contour for the shape 1 and the contour for the shape 2 intersect in this example, resulting in a short. The resulting union of the contours 420 and 425 generates the pattern 430. As shown, the pattern 430 did not meet the specifications within the original design layout represented by the pattern 405 in which shapes 1 and 3 are not meant to connect to each other.

Using DPL techniques creates a new challenge for the layout designers because the designers have to satisfy the requirements of DPL techniques in addition to Design Rule Checking (DRC) and Design For Manufacturability (DFM) requirements. Moreover, fixing a double patterning (DP) loop violation (an odd loop) is much more complex than fixing a DRC violation. This is because a DRC violation is usually a violation caused by a single shape or interaction of a few shapes whereas a DP loop violation is a set of spacing constraint violations between three or more shapes. It is also relatively more difficult to figure out whether moving a shape to fix a DP loop violation results in a new DP loop violation.

There are several existing approaches that address DP loop violations. One of the approaches is editing layouts manually. This approach is time and manpower intensive because the designers have to go through several iterations of edits to figure out the problems and fix them. Thus, this approach has to rely on skills of the designers in finding a solution to a DP loop violation, which is not as straightforward as finding a solution for a DRC violation.

Another of the existing approaches is an automatic Rip and Reroute technique. The Rip and Reroute technique rips the shapes and reroutes the shapes to resolve a design rule violation. The Rip and Reroute technique uses a minimum same color spacing as a spacing constraint. That is, this technique separates the shapes in a design layout such that all shapes are apart from one another at a distance greater than or equal to a minimum same color spacing. Using this technique therefore results in separating two shapes that have different colors at a distance that is greater than a distance at which shapes with different colors should be apart from each other.

Some Rip and Reroute techniques may be track-based. When the technique is track-based, the technique assigns different colors to predefined tracks. Thus, track-based Rip and Reroute technique may not fully utilize all available space in the design layout because the shapes may not occupy all available track spaces. In addition, the Rip and Reroute technique is computation-intensive and slow because the shapes have to be ripped and rerouted. Also, this technique is of limited use for full custom layouts because the technique modifies existing routing topology to fix a design violation. Finally, the technique also requires connectivity information in the layout.

BRIEF SUMMARY

Some embodiments of the invention provide a method for automatically identifying and displaying double patterning loop violations (odd loops) in an IC design layout. The method of some embodiments also generates layout fixing guidelines (hints) for the resolution of the odd loops, identifying the hints by evaluating the effectiveness and feasibility of different potential resolutions and ensuring that hints do not create additional odd loops. The method of some embodiments also prioritizes or scores the resolution hints to facilitate efficient troubleshooting of odd loop violations and displays indications of the odd loops and the hints which a user can use to troubleshoot an odd loop violation.

In some embodiments, the method first identifies one or more shape sets in the design layout. A shape set is a set of shapes in which one shape is within a threshold distance from at least one other shape. The method of some embodiments uses a graph in which the shapes are nodes or represented as the nodes. The method connects a pair of nodes with a link (e.g., a line or an edge) in the graph when the pair of shapes represented by the pair of nodes are within the threshold distance. In a graph representing a disjoint set, a node is connected to any other node by one or more links and nodes. A node is directly connected to another node when these two nodes are connected by a link.

In some embodiments, the method identifies the DP loop violations in a design layout and displays the odd loops and resolution hints for each identified odd loop violation. The method receives shapes from a layer of a design layout from the design layouts and identifies odd loops within the layout. The method of some embodiments identifies the location of the loop as well as the shapes making up the odd loop.

In some embodiments, the method identifies the error gaps of the odd loop. Error gaps are all of the spaces between shapes that make up an odd loop. Each error gap will be less than the minimum same color spacing of a layout. However, not all error gaps are hints. Hints are identified when the removal of a particular error gap would result in the removal of an odd loop without the creation of a new odd loop. In some embodiments, fixing or removing an error gap involves growing the error gap until it meets the minimum same color spacing requirement. When the error gap meets the minimum same color spacing requirement, the shapes on both sides of the error gap can be printed on a single mask and no longer create a DP loop violation.

In some embodiments, the method evaluates the edges of the shapes on either side of the hint error gap to determine both the movability and the effectiveness of the hint. The movability measures a distance by which an edge of a hint error gap can be moved within the constraints of the design. The effectiveness measures the number of loops that may be removed by the breakage of a particular error gap. The method of some embodiments may also generate move instructions which are instructions used by an application to provide indications of a distance by which an edge needs to be moved in order to fix or remove a hint error gap.

In some embodiments, the method evaluates the properties of the hints to prioritize or score each hint. The method sorts hints based on different qualities of the hint that may allow for efficient or simple resolution. These hints may be sorted for a particular loop, providing recommended solutions for a particular odd loop. These hints may also be sorted for an entire layer of a design layout, providing recommended hints to resolve all of the odd loops with the fewest adjustments.

The preceding Summary is intended to serve as a brief introduction to some embodiments of the invention. It is not meant to be an introduction or overview of all of the inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawing, but rather are to be defined by the appended claims, because the claimed subject matters can be embodied in other specific forms without departing from the spirit of the subject matters.

DETAILED DESCRIPTION

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Figure 1:
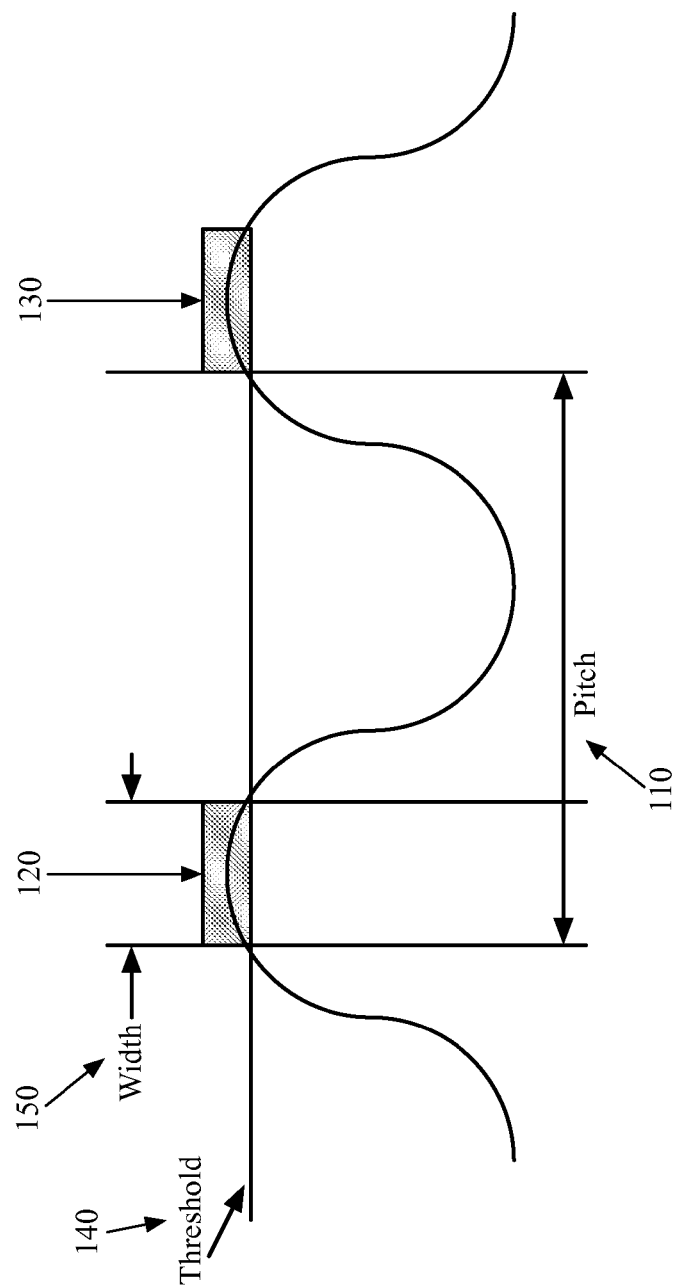
FIG. 1 illustrates a typical pitch constraint of a photolithographic process.
Figure 2:
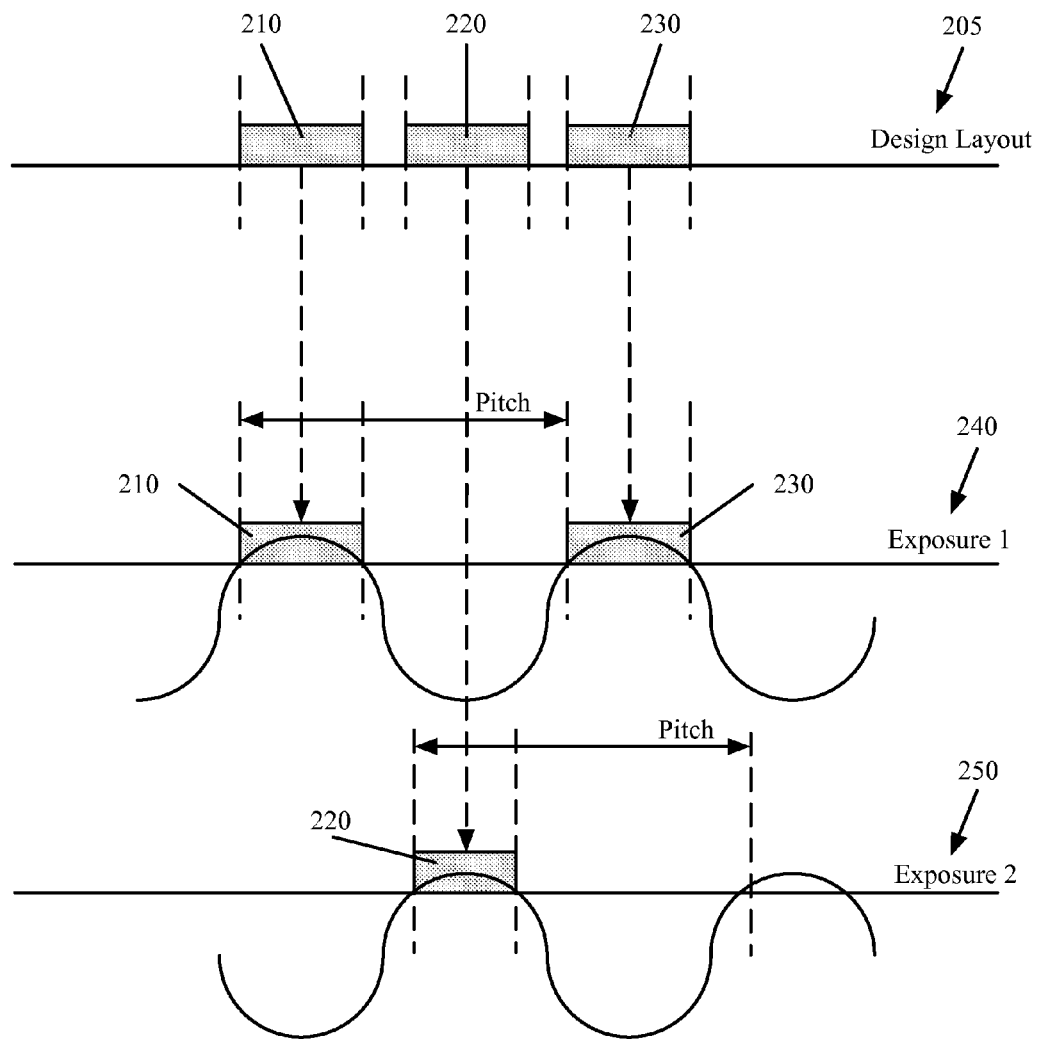
FIG. 2 illustrates an example of "Double Patterning Lithography (DPL)" technology.
Figure 3:
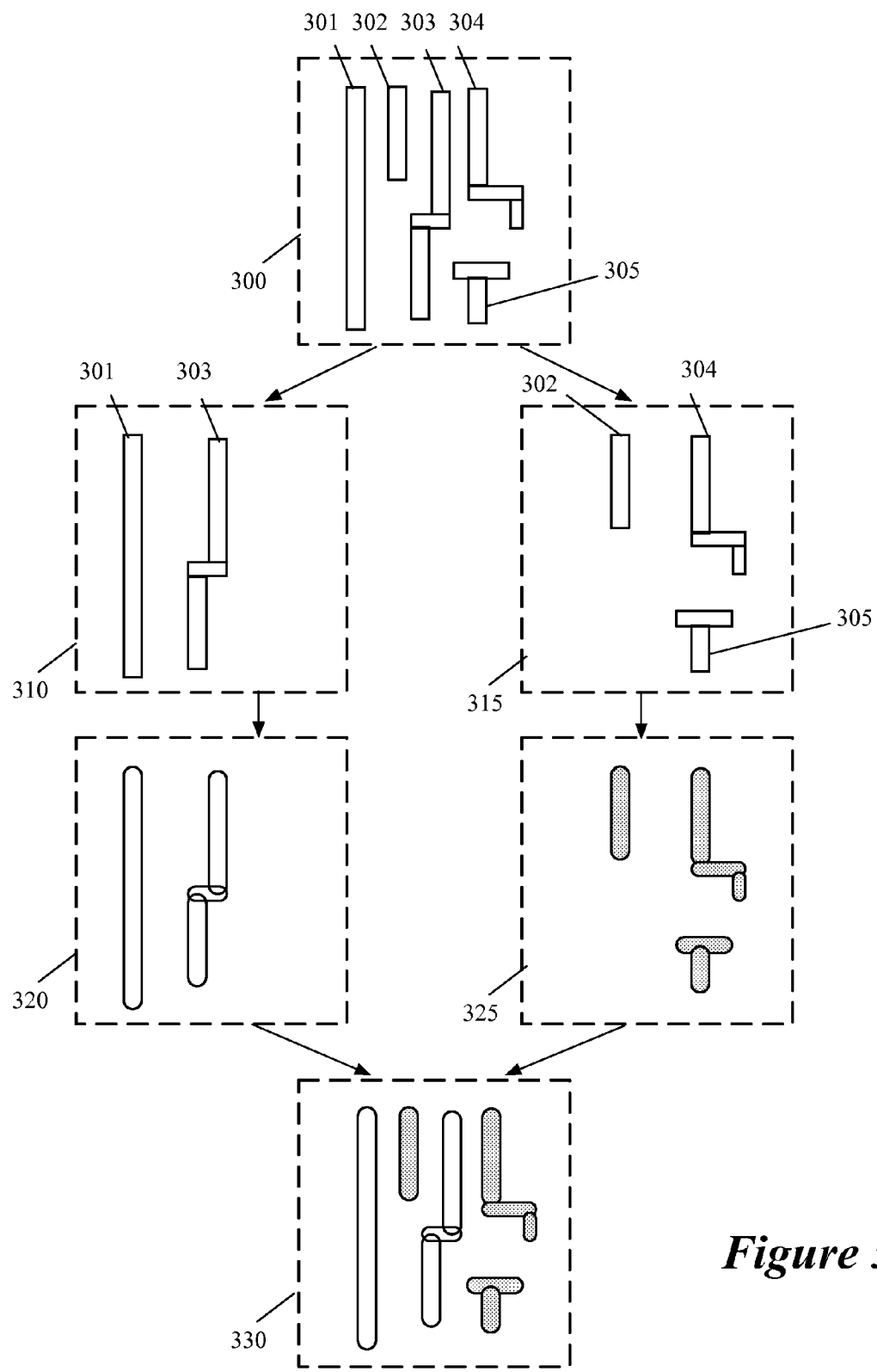
FIG. 3 illustrates sending shapes to different masks.
Figure 4:
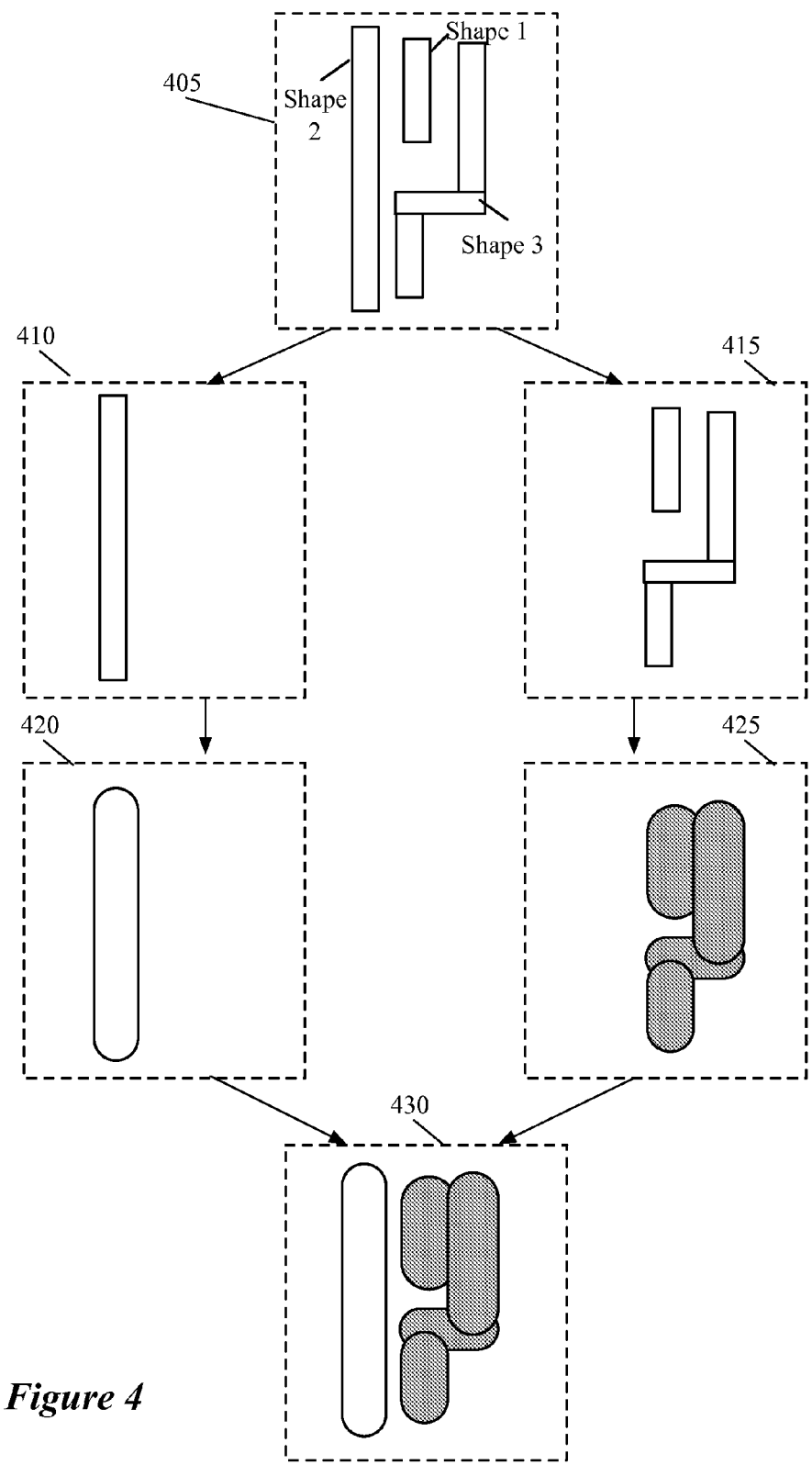
FIG. 4 illustrates an example printing error that is materialized on a physical wafer.
Figure 5:
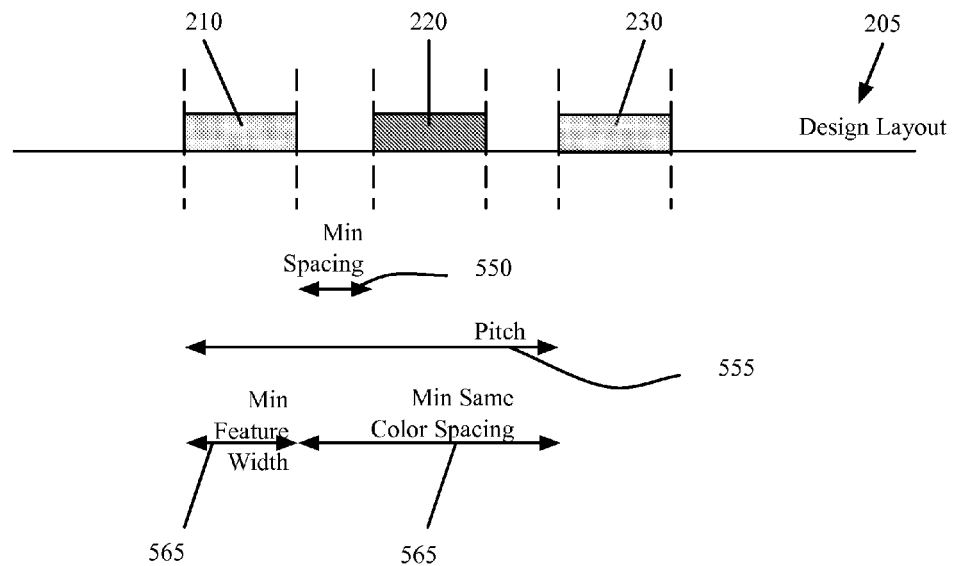
FIG. 5 illustrates the different distances referenced in this application.

FIG. 5 illustrates the different distances referenced in this application, referring to the same design layout 205 from FIG. 2. FIG. 5 illustrates the design layout 205 and three features 210-230. The minimum spacing 550 refers to the minimum distance between two shapes 210 and 220 within the design layout 205. Pitch 555 refers to a manufacturer constraint that includes the minimum feature width 560 and the minimum same color spacing 565 to one side. The minimum feature width 560 is the minimum width for a printed feature in an IC layout. The minimum same color spacing 565 is the minimum distance between two shapes printed on the same mask. The use of DPL technology allows for the minimum spacing to be much smaller than the minimum same color spacing constraint of single pattern printing. When two shapes are within the minimum same color spacing, the space between the two shapes will be referred to as gaps in this patent application.

To use DPL technology, the layout designers need to follow a set of design rules or constraints while designing the layout such that the shapes on a single design layer can be successfully fabricated using two different masks. EDA tools of some embodiments assign two colors (e.g., red and green) to the shapes to identify the two masks with which the shapes will be fabricated. Each shape on a design layer begins with its color unassigned. The EDA tool of some embodiments assigns one of the two colors to each shape on the layer. Shapes that have been assigned to the same color must be spaced apart by at least a certain minimum distance specified by the design rules. Typically, the required minimum spacing between shapes assigned to the same color is greater than the required minimum spacing between two shapes with different colors because shapes with different colors are fabricated using different masks, bypassing the limitations of the single-exposure photolithographic process.

A specific color that is assigned to a particular shape is arbitrary. However, the assignment makes sure that the shapes adjacent to the particular shape that are spaced apart from the particular shape by less than a minimum same color spacing have different colors. The minimum same color spacing is the minimum distance between two shapes printed on the same mask.

I. Hint Generation

Figure 6:
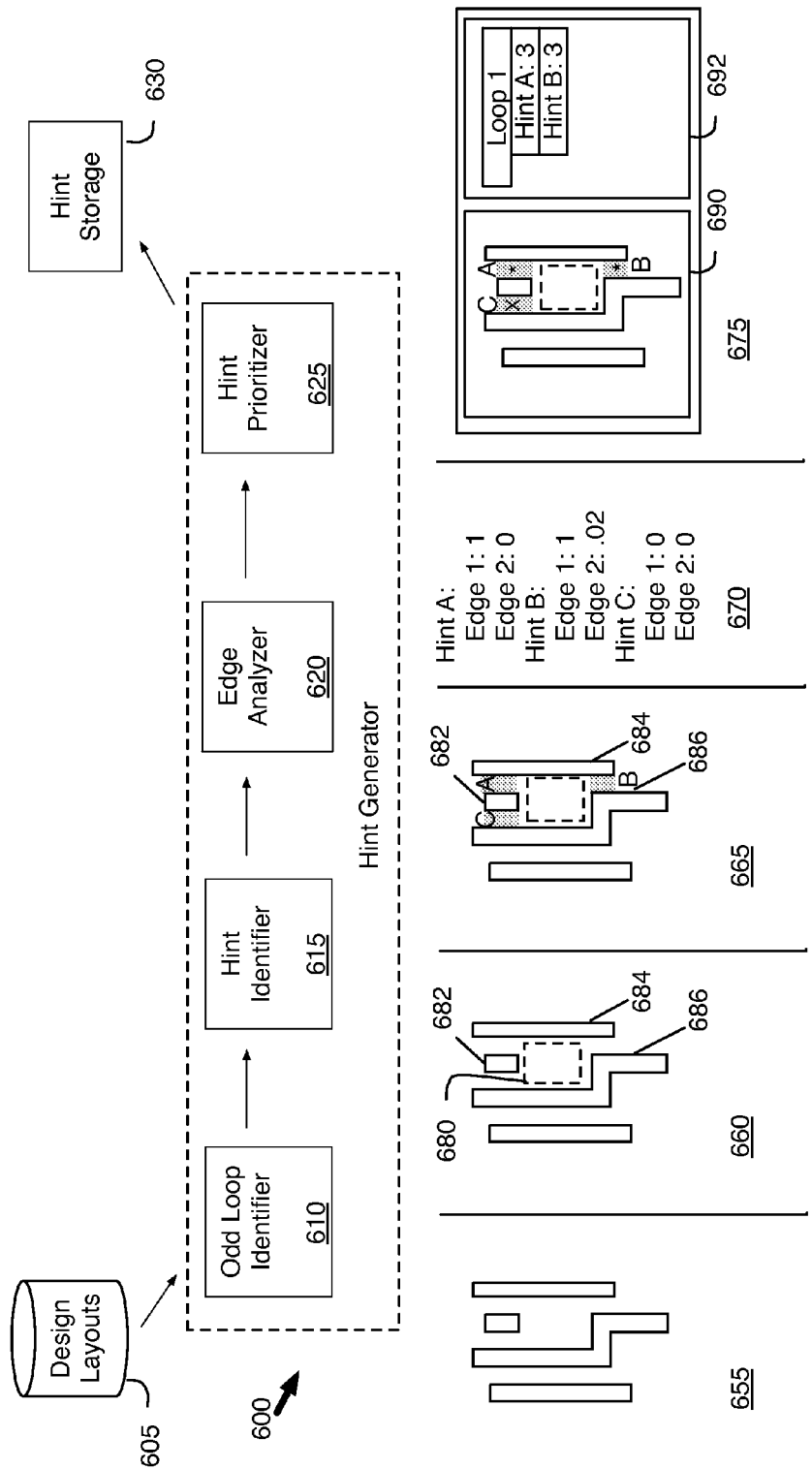
FIG. 6 illustrates a hint generator for identifying and prioritizing odd loops and resolution hints in a layer of a circuit design in some embodiments of the invention.

FIG. 6 illustrates a hint generator 600 for identifying and prioritizing odd loops and resolution hints in a layer of a circuit design in some embodiments of the invention. FIG. 6 also illustrates design layouts 605 and a hint storage 630. FIG. 6 will be described in further detail with reference to FIGS. 7 and 8.

The design layouts 605, in some embodiments, are generated by EDA applications, which circuit designers use to generate design layouts. As known in the art, a design layout includes several design layers that represent an IC's multiple layers of wiring that interconnect the IC's electronic and circuit components. In some embodiments, the design layouts are in a database file format, e.g., GDS II stream format (GDSII).

The hint storage 630 in some embodiments stores the results to a user interface of an EDA application which allows the user to directly interact with the provided resolution hints. The hint storage 630 may store the shapes, hints, scores and strengths of an odd loop and each of the hints associated with that odd loop. The hint storage 630 may store the resulting hints to a file in a format which stores the resolution hints for display at another location or for further processing in another application.

The hint generator 600 identifies the DP loop violations in a design layout and displays the odd loops and resolution hints for each identified odd loop violation. As shown, the hint generator 600 includes an odd loop identifier 610, a hint identifier 615, an edge analyzer 620, and a hint prioritizer 625. In some embodiments, the hint generator 600 is a stand-alone software application that is separate from an EDA application that generates and displays the design layouts. In other embodiments, the hint generator 600 is part of the EDA application.

The odd loop identifier 610 receives shapes from a layer of a design layout from the design layouts 605. The odd loop identifier 610 identifies odd loops within the layout. The process used to identify these odd loops is disclosed in U.S. patent application Ser. No. 13/555,058 entitled "Method and Apparatus for Identifying Double Patterning Loop Violations," which is incorporated herein by reference. The odd loop identifier 610 of some embodiments identifies the location of the loop as well as the shapes making up the odd loop.

Some EDA tools model each shape in a design layout as a node in a graph. Each of the nodes represents a shape in the design layout. When a gap exists between two shapes, meaning the two shapes are within the minimum same color spacing, the two nodes are considered connected; this connection is represented by a link. In some cases, the gaps or links between two shapes or nodes can be considered a complex gap or a complex link when there are multiple gaps between two shapes. A complex link may be represented in a node graph with multiple links between two particular nodes.

After this modeling process, the layout is represented as clusters of graphs in which nodes are connected. Each node in a graph is assigned a color in such a way to make sure that the neighboring nodes have different colors. This is because when the neighboring nodes (e.g., a connected pair of nodes) have the same color, the corresponding shapes would violate a design rule that requires two shapes with the same color are apart from each other at a distance greater than or equal to the minimum same color spacing. However, when the nodes in a graph form a loop and there are an odd number of nodes in such graph, it is not possible to assign different colors to all pairs of nodes of the graph. This error-causing loop will be referred to as an odd loop in this patent application.

Figure 7:
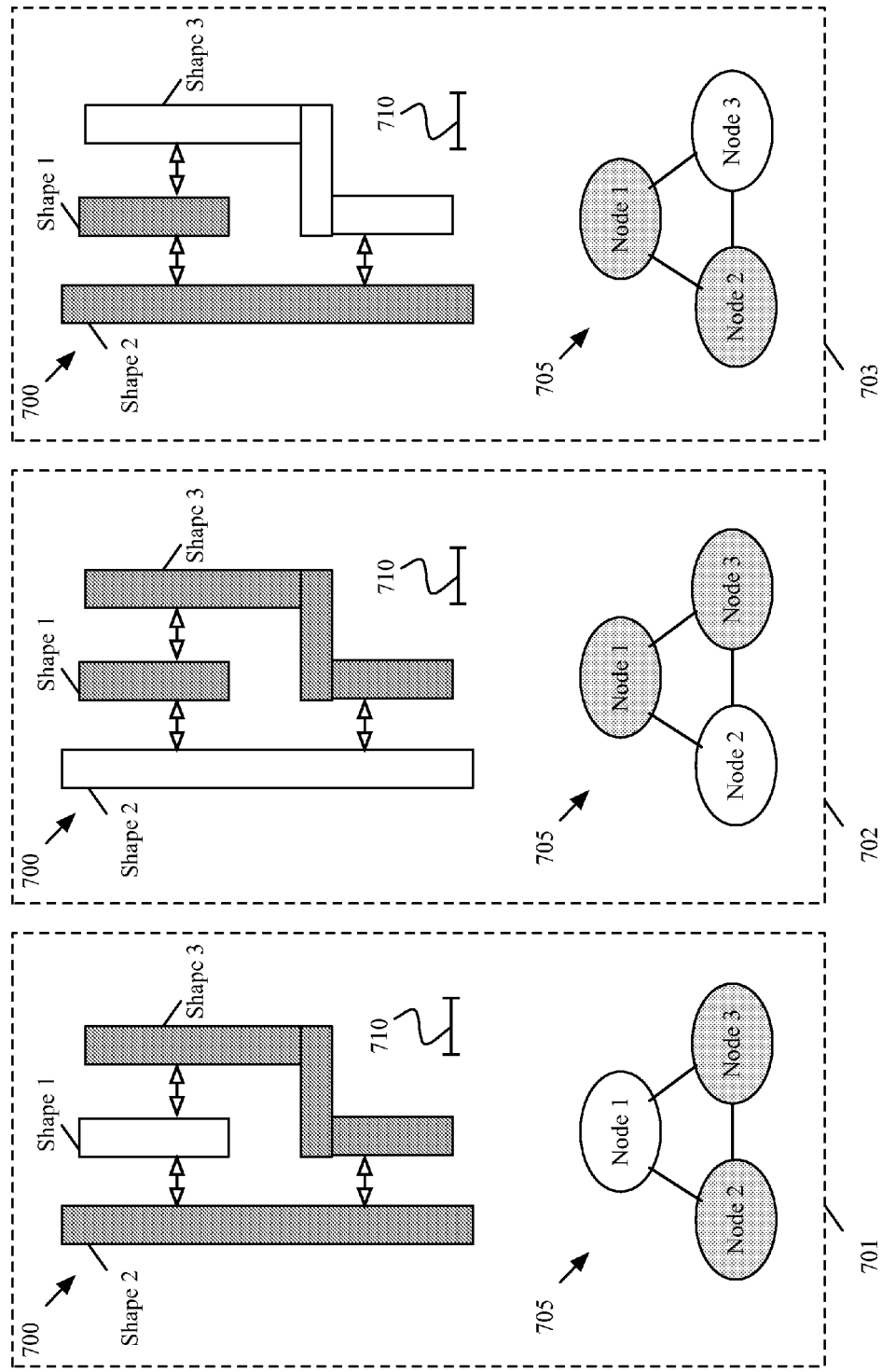
FIG. 7 illustrates a node graph that forms an odd loop.

FIG. 7 illustrates a graph 705 that has three nodes that form such a loop. The node graph 705 represents shapes 1-3 in a layer of a design layout 700. This figure illustrates three different color assignments 701-703 to show that it is not possible to assign different colors to adjacent nodes in a graph that has an odd number of nodes forming a loop. Nodes 1-3 of the graph 705 represent the shapes 1-3, respectively.

Two different colors, a first color and a second color, are assigned to the shapes 1-3. The first color is depicted as gray and the second color is white in this example. This figure also illustrates a minimum same color spacing 710 depicted as a horizontal line with two ends having vertical bars. As shown, shape 3 is depicted as three connected rectangles. These three rectangles are connected by design and treated as one shape. The shapes depicted in the figures of this patent application shown as multiple connected rectangles are treated as one shape.

The shapes 1 and 2 are violating the pitch requirement. That is, the two shapes are apart from each other at a distance smaller than the minimum same color spacing 710. So are the shapes 2 and 3. So are the shapes 3 and 1 because the bottom portion of shape 3 is apart from the shape 2 at a distance smaller than the minimum same color spacing 710. Accordingly, the nodes 1-3 of the graph 705 are connected to each other, resulting in a loop.

When the number of nodes is odd, it forms an odd loop and it becomes impossible to print the nodes on two masks without a pair of neighboring nodes being printed on the same mask. When an odd loop is created, the spaces between the shapes of the loop are called error gaps.

The three different colors assignments 701-703 show the three possible ways of assigning two different colors to the nodes 1-3 and the corresponding shapes 1-3. As shown, no matter how the color assignment is done, one pair of neighboring nodes has the same color. That is, there is always going to be a pair of shapes that would be violating the design rule.

Figure 8:
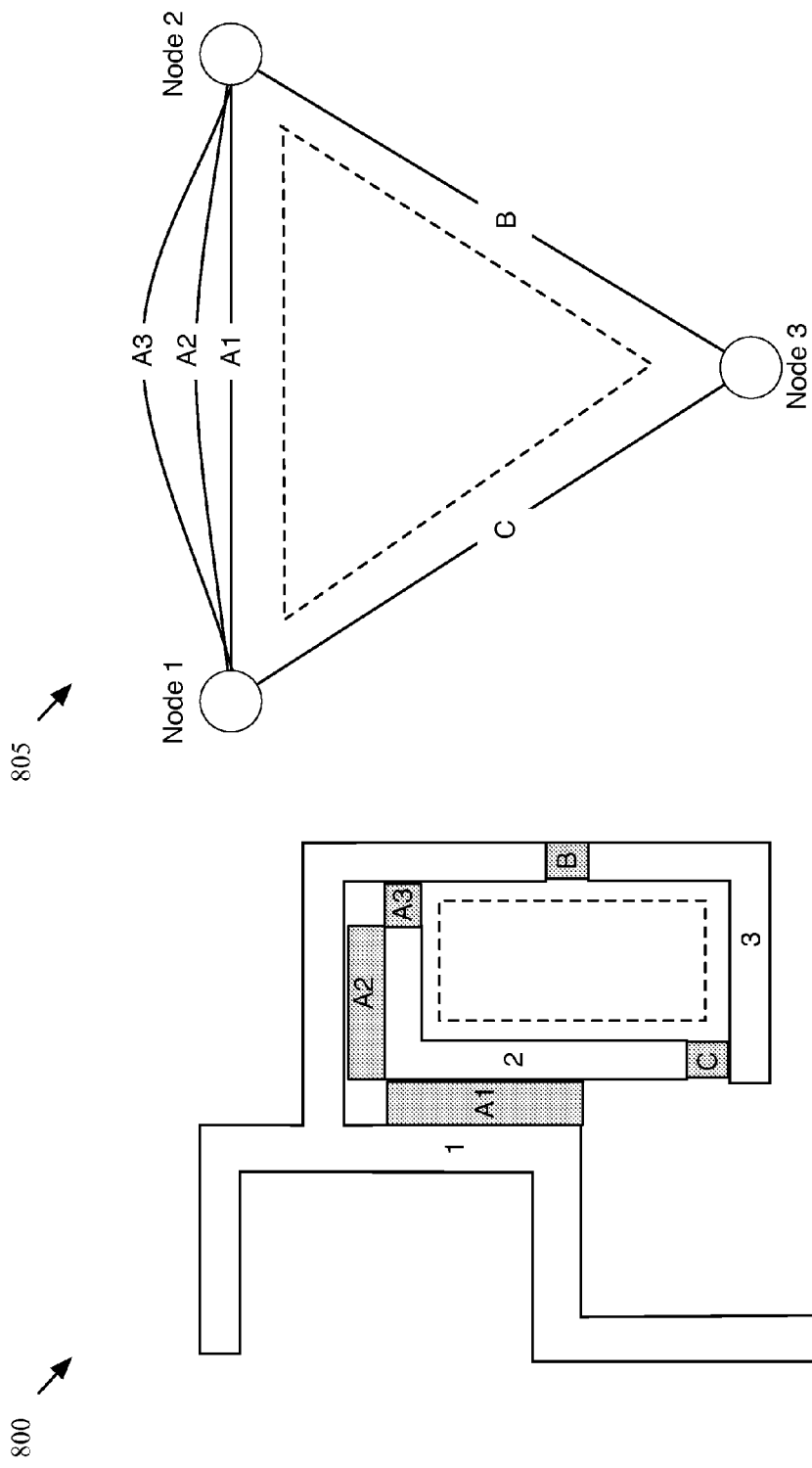
FIG. 8 illustrates an example of an odd loop containing a complex error gap in a circuit design layout.

FIG. 8 illustrates an example of an odd loop containing a complex error gap in a circuit design layout. FIG. 8 shows a shape set 800 and a corresponding node set 805. The shape set 800 shows a set of shapes 1-3, separated by gaps A-C. Complex error gap A is composed of three sub-gaps, A1-A3. The node set 805 illustrates a node set representation of the shapes of 800, with shapes 1-3 illustrated by corresponding nodes 1-3 and gaps B and C illustrated by corresponding links B and C respectively. Complex error gap A is represented by multiple links A1-A3.

The hint identifier 615 receives the shapes (or nodes) and the odd loop information from the odd loop identifier 610. The hint identifier 615 identifies the error gaps of the odd loop. Error gaps are all of the spaces between shapes that make up an odd loop. Each error gap will be less than the minimum same color spacing of a layout. However, not all error gaps are hints. Hints are identified when the removal of a particular error gap would result in the removal of an odd loop without the creation of a new odd loop. In some embodiments, fixing or removing an error gap involves growing the error gap until it meets the minimum same color spacing requirement. When the error gap meets the minimum same color spacing requirement, the shapes on both sides of the error gap can be printed on a single mask and no longer create a DP loop violation.

The edge analyzer 620 evaluates the edges of the shapes on either side of the hint error gap. The edge analyzer 620 analyzes each of edge of each hint error gap to determine both the movability and the effectiveness of the hint. The movability measures a distance by which an edge of a hint error gap can be moved within the constraints of the design. The effectiveness measures the number of loops that may be removed by the breakage of a particular error gap. The edge analyzer 620 of some embodiments may also generate move instructions which are instructions used by an application to provide indications of a distance by which an edge needs to be moved in order to fix or remove a hint error gap.

The hint prioritizer 625 evaluates the properties of the hints to prioritize or score each hint. The hint prioritizer 625 sorts hints based on different qualities of the hint that may allow for efficient or simple resolution. These hints may be sorted for a particular loop, providing recommended solutions for a particular odd loop. These hints may also be sorted for an entire layer of a design layout, providing recommended hints to resolve all of the odd loops with the fewest adjustments.

A. Hint Identification

Figure 9:
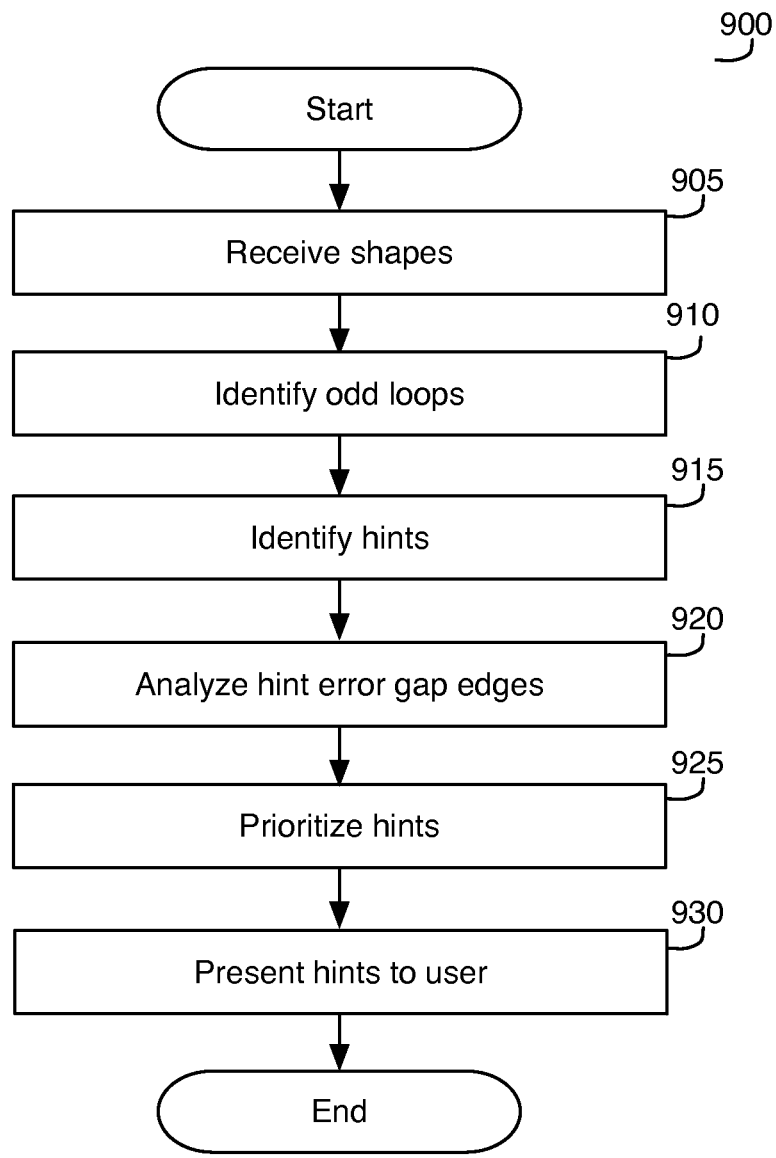
FIG. 9 conceptually illustrates a process for identifying and presenting hints related to odd loops within a circuit design.

An example operation of the hint generator 600 will now be described by reference to FIGS. 6 and 9. FIG. 9 conceptually illustrates a process 900 for identifying and presenting hints related to odd loops within a circuit design. The process 900 may be performed by the hint generator 600 of FIG. 6 in some embodiments. The process 900 may be performed on a layer of a circuit design layout at the request of a user of an EDA application. Alternatively, the process 900 may be performed automatically at a predetermined interval or as changes are made to the design layout, providing a user with feedback regarding odd loop violations and hints throughout the design process.

The process 900 receives (at 905) shapes of a layer of a circuit design layout. These shapes may be received from an EDA application or from some other input or storage device, such as the storage for the design layouts 605. The process identifies (at 910) odd loops in the layer, as illustrated in the second stage 660. In this example, the odd loop identifier 610 receives the shapes of 655 and identifies an odd loop 680 created by shapes 682-686.

For each odd loop, the process 900 identifies (at 915) hints that indicate potential solution areas of the design by analyzing the error gaps of each odd loop, illustrated in stage 665 as the grey areas A-C between the shapes 682-686. In this example, these error gaps are also associated with hints because fixing these would break the odd loop 680 and would not create a new odd loop.

The process 900 then analyzes (at 920) the edges of these hint error gaps to determine the properties of the edges surrounding the error gap. In the case where the hint error gaps are complex error gaps (made up of multiple sub-gaps), the process 900 analyzes the edges of all of the sub-gaps of the complex error gap. These edges may be analyzed to determine the movability of each edge in some embodiments. The movability of an edge is the distance which an edge can be moved away from an error gap. As illustrated in stage 670, the error gap of hint A has one edge which is movable because shape 684 can be moved to the right. The error gap of hint B has two movable edges because shape 684 can be moved and because a horizontally-running portion of shape 686 can be shortened to widen the error gap. The error gap of hint C has no movable edges because neither shape 686 or 682 can be moved without violating the minimum spacing. This is because shape 682 cannot move closer to shape 684 and shape 686 cannot move closer to shape 686 without violating the minimum spacing. The calculation of the movability of the edges will be described further below with reference to FIG. 15. The process 900 may further determine whether an error gap can be readily fixed by comparing the width of the existing gap and the movability of the edges with the minimum same color spacing of the design layout.

The process 900 then prioritizes (at 925) the hints identified at 915 based on the error gap edge information determined at 920. In some embodiments, the hints are first scored based on properties of the hint and the edges of the hint error gap and then prioritized based on the assigned score. The score assignment will be described in detail below. These hints may then be stored in a storage 630.

Once the hints have been prioritized and stored, the process 900 presents (at 930) the hints to the user with indications of the priority and location of each hint within the design. As illustrated in stage 675, scores are presented in a display area along with visual indicators for the odd loop 680 and the hints A-C along with the shapes 682-686 of the odd loop. In some embodiments, the scores are used to determine a priority but are not presented to the user. The process 900 then ends.

Once all of the odd loops have been identified, trivial loops are identified as loops which are completely enclosed by a pair of nodes and the links between those nodes. All the remaining loops, which are neither odd loops nor trivial loops, are referred to as "non-odd" loops.

Figure 10:
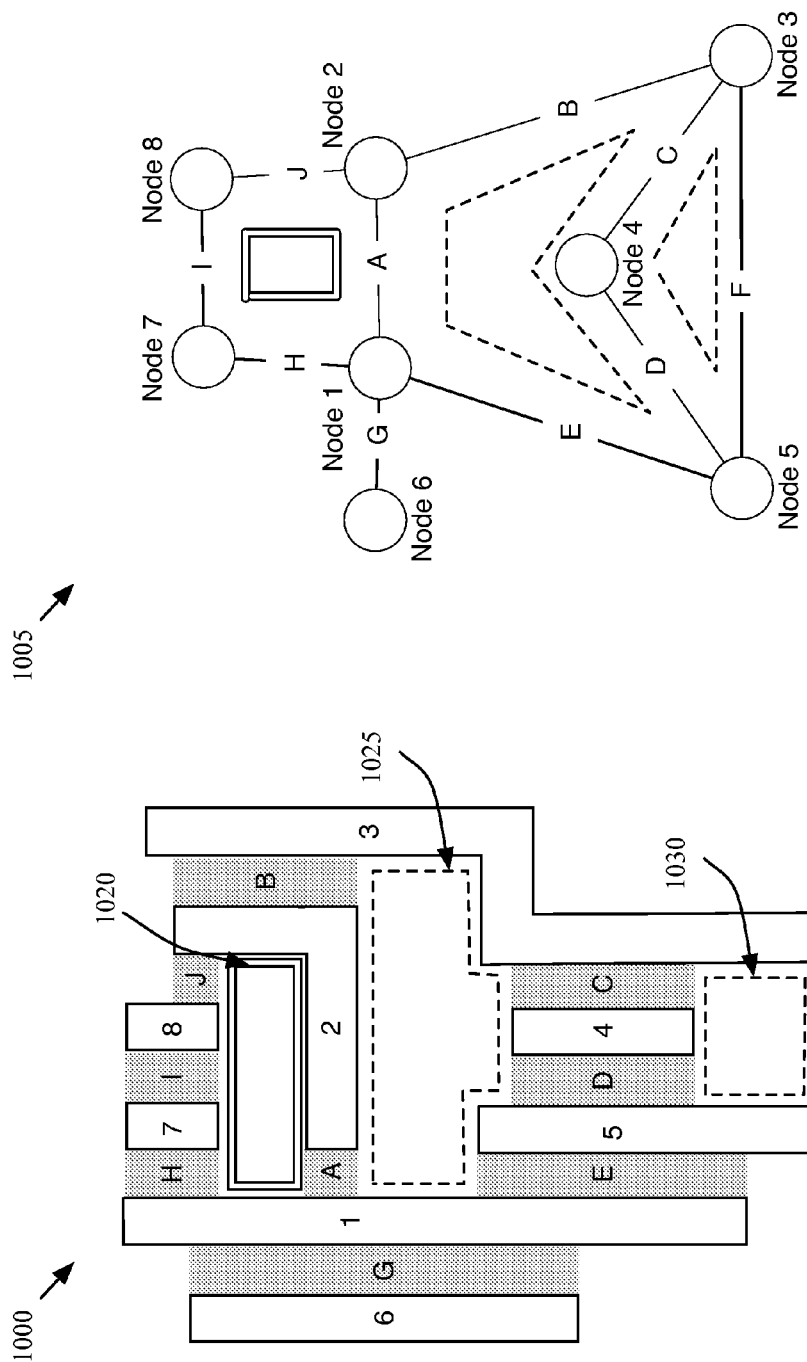
FIG. 10 illustrates an example of the loops which may occur during the double patterning (DP) process.

FIG. 10 illustrates an example of loops which may occur during the double patterning (DP) process. FIG. 10 shows a shape set 1000 and a corresponding node set 1005. The shape set 1000 shows a set of shapes 1-8, separated by error gaps A-J. Error gaps are gaps between two shapes separated by less than the minimum same color spacing (but more than the minimum spacing) which have to be printed on different masks. The node set 1005 illustrates a node set representation of the shapes of 1000, with shapes 1-8 illustrated by corresponding nodes 1-8 and error gaps A-J illustrated by corresponding links A-J respectively.

The shape set 1000 also shows (1) a non-odd loop 1020 indicated by the double-lined rectangle between shapes 1, 7, 8, and 2, (2) an odd loop 1025 indicated by a dashed-line shape between shapes 1-5, and (3) an odd loop 1030 indicated by a dashed-line rectangle between shapes 3-5. Non-odd loop 1020 is a non-odd loop because it is made up of an even number (four) of shapes 1, 7, 8, and 2. Odd loop 1025 is an odd loop because it is made up of an odd number (five) of shapes 1-5. Odd loop 1030 is an odd loop because it is made up of an odd number (three) of shapes 3-5. As described above, odd loops cause errors during the double patterning process because it is impossible to print an odd loop without violating a Double Patterning Lithography (DPL) constraint. The odd loop 1020 and non-odd loop 1025 are illustrated by the loops created by the links A-E and the links A, G, I, and H respectively. Odd loops 1025 and 1030 illustrate that shapes (or nodes) 3-5 can be a part of multiple loops 1025 and 1030.

Figure 11:
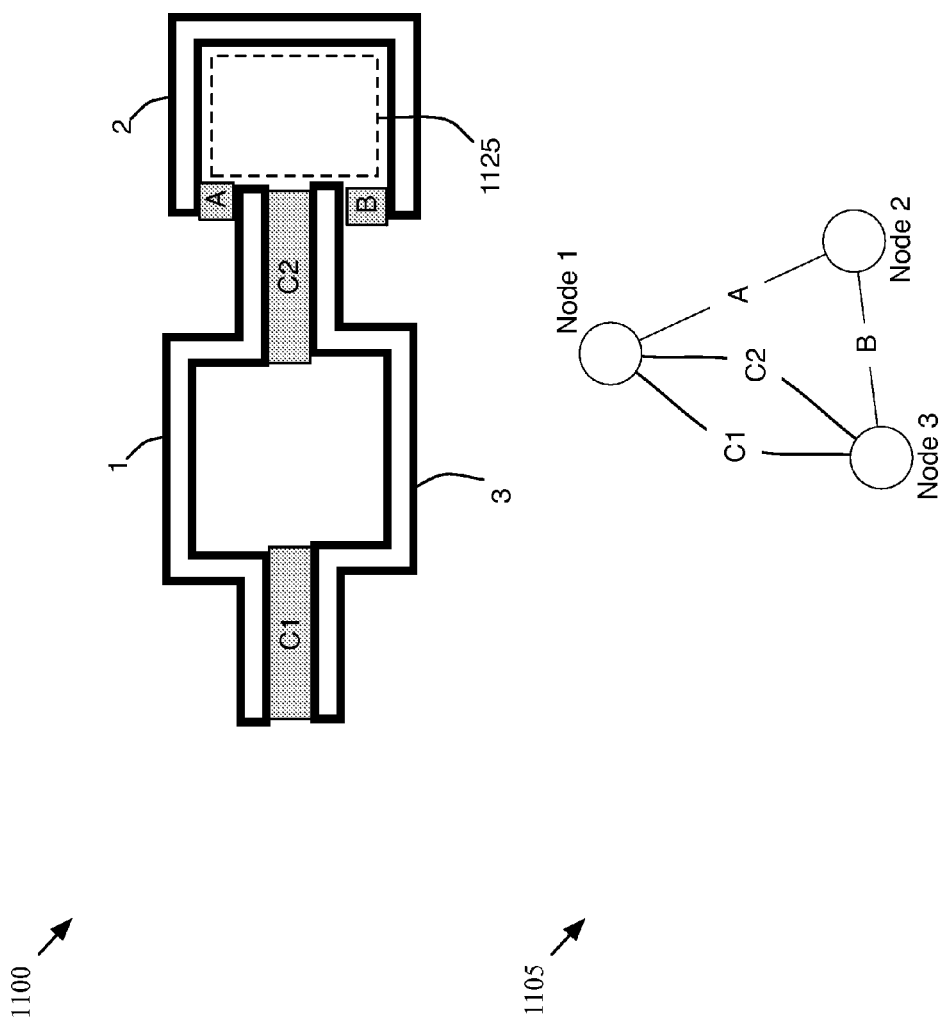
FIG. 11 illustrates an example of a loop which contains a complex error gap in a circuit design layout.

FIG. 11 illustrates an example of a loop which contains a complex error gap in a circuit design layout. FIG. 11 shows a shape set 1100 and a corresponding node set 1105. The shape set 1100 shows a set of shapes 1-3, separated by error gaps A-C. Error gap C is a complex error gap composed of two sub-gaps, C1 and C2. In order to resolve a complex error gap, each of the sub-gaps must be resolved. The node set 1105 illustrates a node set representation of the shapes of 1100, with shapes 1-3 illustrated by corresponding nodes 1-3 and error gaps A and B illustrated by corresponding links A-C respectively. Complex error gap C is represented by multiple links C1 and C2. The shape set 1100 illustrates an odd loop 1125. As represented by the multiple links C1 and C2, resolving only one of the sub-gaps C1 and C2 would not be sufficient to resolve loops involving complex error gaps. Removing sub-gap C1 would not affect odd loop 1125 and removing sub-gap C2 would enlarge the area of the gap, but would maintain an error loop between the same shapes 1-3. However, when both sub-gaps C1 and C2 are resolved, shapes 1-3 no longer form an odd loop.

Figure 12:
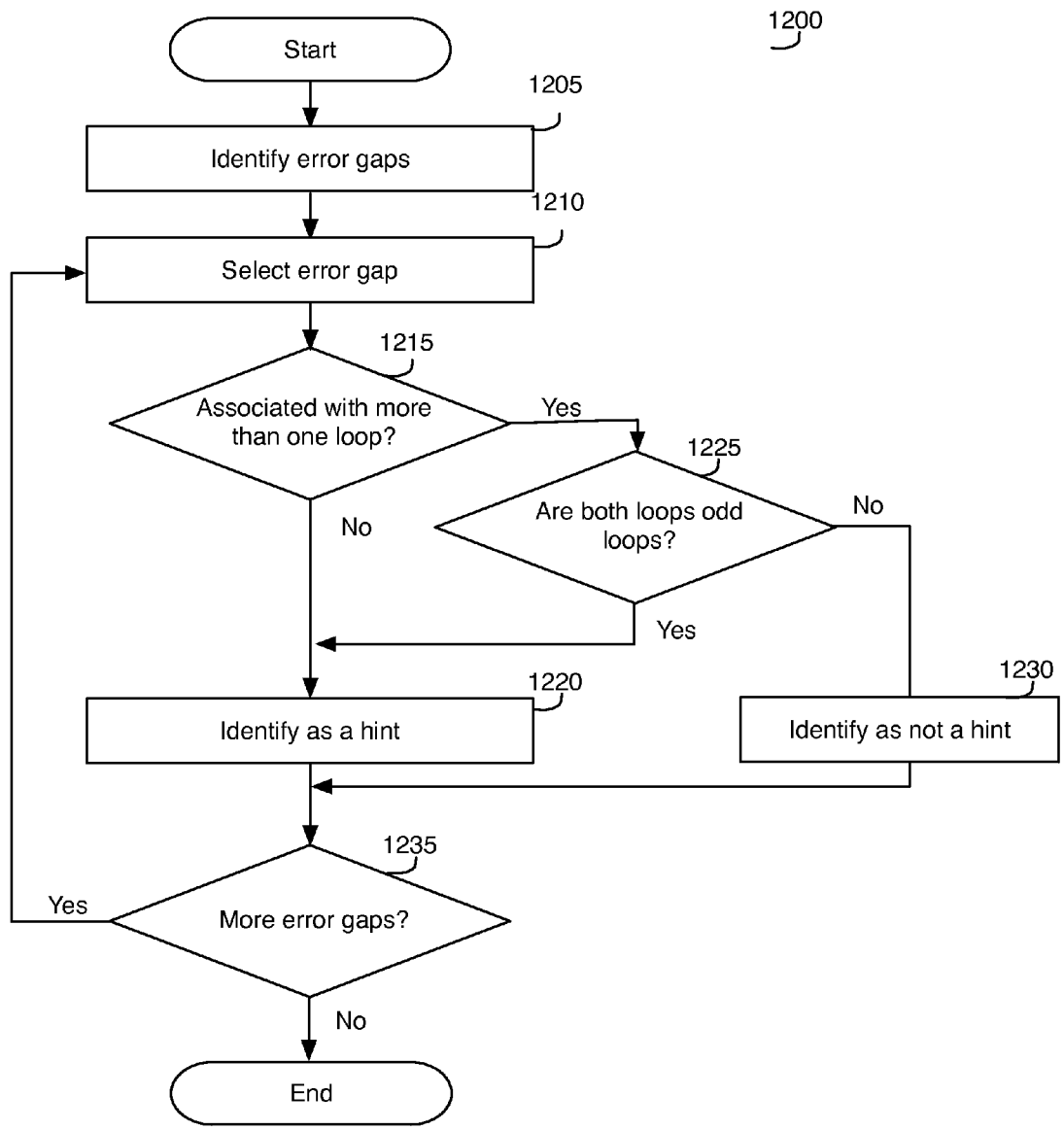
FIG. 12 conceptually illustrates a process of some embodiments used to identify hints for each odd loop.

FIG. 12 conceptually illustrates a process 1200 of some embodiments to identify hints for each odd loop. FIG. 12 will be described with reference to FIGS. 10 and 13. The process 1200 identifies (at 1205) the error gaps for the particular odd loop. The process selects (at 1210) one of the error gaps identified at 1205. The process may select an error gap at random or in an order based on the location of the error gap within the layer of the design layout.

The process then determines (at 1215) whether the error gap is associated with more than one loop. In the example of FIG. 10, error gaps A, C and D would all be associated with more than one loop. Error gap A is associated with non-odd loop 1020 and odd loop 1025, while error gaps C and D are associated with odd loops 1025 and 1030.

Figure 13:
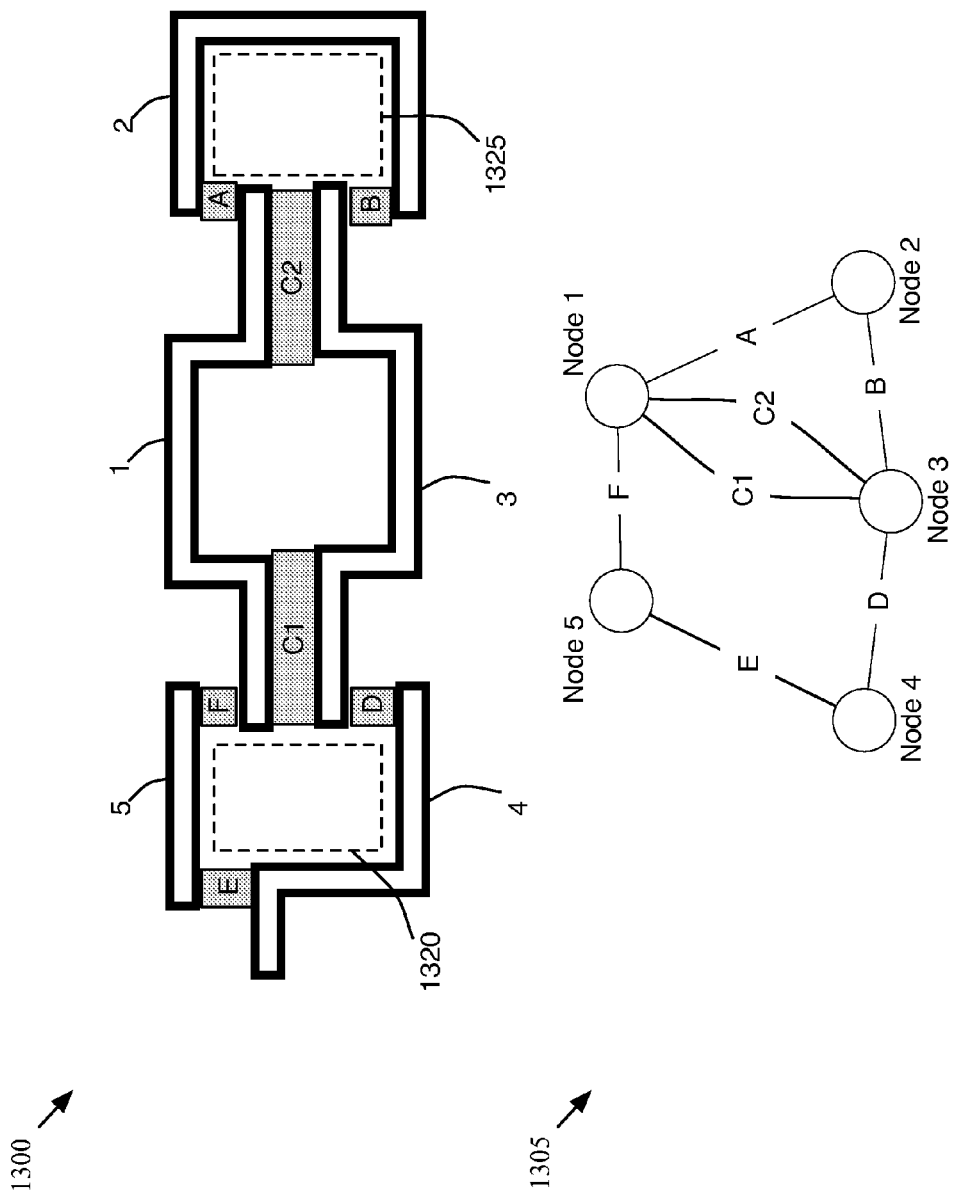
FIG. 13 illustrates an example of loops which contain a complex error gap in a circuit design layout.

FIG. 13 illustrates an example of multiple loops which contain a complex error gap in a circuit design layout. FIG. 13 shows the shape set 1300, corresponding node set 1305, and error loop 1325 described in FIG. 11 with the addition of shapes and nodes 4 and 5 connected by links D, E, and F to create non-error loop 1320. In the example of FIG. 13, complex error gap C would be associated with both loops 1320 and 1325, because sub-gap C1 faces loop 1320 and sub-gap C2 faces loop 1325.

When the process 1200 determines (at 1215) that the selected error gap is not associated with another loop, then the process 1200 identifies (at 1220) the selected error gap as a hint and proceeds to 1235 described below. When the process 1200 determines (at 1215) that the selected error gap is associated with another loop, the process determines (at 1225) whether both loops are odd loops. When both loops are odd loops, meaning two odd loops are associated with the same error gap, then the process 1200 identifies (at 1220) the selected error gap as a hint and proceeds to step 1235 described below. In some embodiments, when both loops are odd loops, the process 1200 may determine that it is not only a hint, but may assign a higher priority or score to the error gap because the removal of the error gap would resolve multiple odd loops.

When the process 1200 determines (at 1225) that one of the loops is not an odd loop, the process 1200 identifies (at 1230) the selected error gap as not a hint. This is because the removal of an error gap between an odd loop and a non-error loop will result in the creation of another, larger, odd loop. In the example of FIG. 10, removing the error gap A between non-odd loop 1020 and odd loop 1025 results in another odd loop with shapes 1, 7, 8, 2, 3, 4, and 5. In the example of FIG. 13, removing sub-gap C2 does not eliminate odd loop 1325 because shapes 1 and 3 remain connected by sub-gap C1. However, even when the entire complex error gap (i.e., sub-gaps C1 and C2) is resolved, a new error loop is created with shapes 1, 2, 3, 4, and 5.

When the gap is a complex error gap, the gap may be associated with more than two loops. In such a case, if the complex error gap interacts with any non-odd loops, then the complex error gap is not a hint because joining an odd loop with a non-odd loop will create a larger odd loop. This is because resolving the complex error gap for the odd loops is done by placing both of the shapes that make up the complex error gap to the same mask. However, an even loop attached to the same two shapes would require that the two shapes be on different masks.

When the process 1200 determines (at 1235) that there are more error gaps associated with the particular odd loop, the process 1200 returns to 1210. Otherwise the process 1200 ends.

B. Movability Calculation

Once an error gap has been determined to be a hint, the flexibility of the gap may be used to determine the usability of the hint. The flexibility of a gap, in some embodiments, is determined based on the movability of the edges of the shapes surrounding the gap. In this patent application, a gap is a feasible gap if the aggregate movability of the edges of the gap plus the current gap width is greater than the minimum same color spacing (the minimum spacing between two shapes on a single mask). As long as the edges of a hint error gap can be moved to create the minimum same color spacing, the hint is determined to be a feasible hint.

Figure 14:
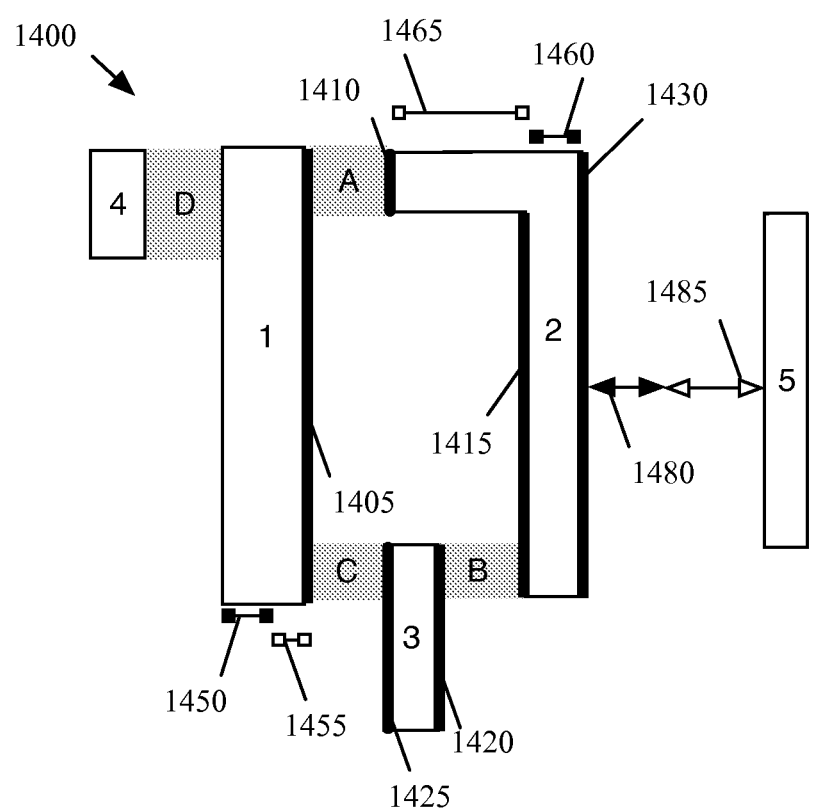
FIG. 14 illustrates a set of shapes and links for determining the movability of an edge.

FIG. 14 illustrates a set of shapes and links for determining the movability of an edge. FIG. 14 illustrates shapes 1-5, gaps A-D, edges 1405-1430, shape widths 1450-1465, and gap widths 1480-1485. In some embodiments, determining the movability of an edge may be performed by the edge analyzer 620 of FIG. 6.

Edges 1405-1425 illustrate different shape edges of an odd loop created by shapes 1-3 which may be evaluated for movability. Edge 1405 covers the entire right edge of shape 1. Edge 1410 covers the portion of shape 2 which borders gap A, and is a separate edge from edge 1415, although they are both on the left side of shape 2. These edges may operate independently of each other and their movability will be calculated separately as well.

An opposing edge from a particular edge is the nearest edge on the opposite side of the shape from the particular edge. In this example, the opposing edge for both edges 1410 and 1415 is edge 1430. However, the opposing edge for edge 1430 would be edge 1415. Although both edges 1410 and 1415 are opposite edge 1430 at different sections, 1415 is the nearest edge.

Figure 15:
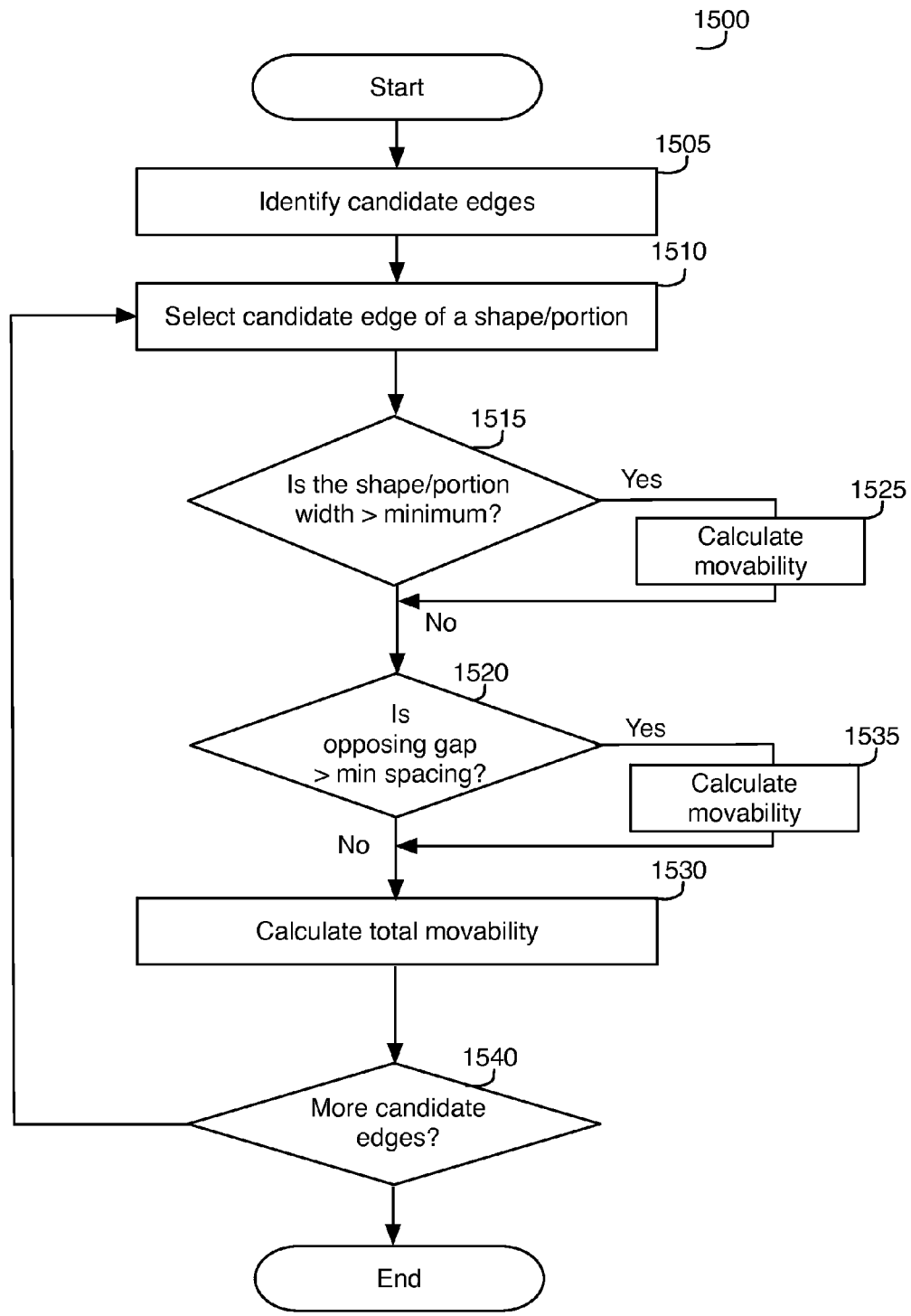
FIG. 15 conceptually illustrates a process of some embodiments for determining the total movability of each edge of an error gap.

FIG. 15, with reference to FIG. 14, conceptually illustrates a process 1500 of some embodiments for determining the total movability of each edge of an error gap. The process 1500 identifies (at 1505) the candidate edges. Candidate edges are the edges that make up the error gaps that make up an odd loop. The candidate edges for a complex error gap would include the edges for each sub-gap of the complex error gap. Edges 1405-1425 are candidate edges in this example.

As illustrated by edge 1420, a candidate edge may extend beyond the area that directly faces an error gap. As shown, the edge may include an entire edge when any portion of that edge faces an error gap. In some embodiments, a candidate edge may be more limited and only include the portion of the edge which directly faces the error gap or include a specified area around the portion of the edge which directly faces the error gap.

The process 1500 then selects (at 1510) one of the candidate edges of a shape or a portion of a shape (e.g., edge 1415). The candidate edge may be selected at random or in an order based on the location of the edge within the layer of the layout design. The process 1500 determines (at 1515) whether the width of the shape/portion is greater than the minimum shape width. The width of a shape/portion is the distance between the edge and the opposing edge. As noted above, when an edge has multiple opposing edges, the opposing edge will be the nearest opposing edge. In this example, the width of the shape/portion measured from edge 1410 will be the distance from edge 1410 to edge 1430. However, the width of the shape/portion measured from edge 1430 will be the distance from edge 1430 to edge 1415.

When the process 1500 determines (at 1515) that the width is not greater than the minimum shape width, then the process 1500 continues to 1520, described below. Otherwise, the process calculates (at 1525) the movability of the edge based on the width of the shape or portion where the edge can be moved by making the shape narrower. This may be referred to as the width movability. The movability will be the amount that the shape or portion width is greater than the minimum shape width. In this example, minimum shape width is illustrated by a line with black boxes on either end. Shape 1 is wider than the minimum shape width 1450 by an excess distance 1455. The movability calculated for the edge 1405 would be the distance 1455. Another example is edge 1410. For the edge 1410, the minimum shape width 1460 leaves the width 1465 as the movable distance for edge 1410. The width movability of an edge is the difference between the width of the shape and the minimum shape width.

The process 1500 determines (at 1520) whether the gap facing the opposing edge of the shape/portion is wider than the minimum spacing for the design layout. When the gap facing the opposing edge of the shape/portion is not wider than the minimum spacing for the design layout, then the process 1500 continues to 1530 described below. When the gap facing the opposing edge is greater than the minimum spacing, the process 1500 calculates (at 1535) the movability of the edge due to the movability of the shape, or the shape movability. In this case, the shape, and therefore the edge, can be moved away from the gap. In this example, edge 1415 is moveable because the gap facing the opposing edge 1430 is greater than the minimum spacing 1480. The movability of an edge would be the difference between the width of the current gap of the opposing edge and the minimum spacing of the design layout. The shape movability of edge 1415 is equal to the width 1485. The process 1500 then continues to 1530.

An example of an edge which would not be movable is illustrated by edge 1430. Edge 1430 would not be movable away from its gap because its opposing edges 1415 and 1410 are facing gaps B and A respectively, which are both minimum spacings. In some embodiments, even if only one of the gaps were a minimum spacing, the edge 1430 would not be movable. This may be the case because in some cases it may be desirable to ensure that single edges are not split into multiple edges by moving only a portion of an edge. Thus, if any portion of an opposing edge is facing a gap with minimum spacing, the edge is not movable. However, in some embodiments, the movability may be calculated separately even for different portions of a single edge, allowing for a portion of an edge to be considered movable.

At 1530, the process 1500 calculates the total movability for the selected candidate edge. The total movability is the sum of the width movability calculated at 1525 and the shape movability calculated at 1535. The process 1540 determines (at 1540) whether there are more candidate edges that need to have the movability calculated. When there are remaining candidate edges, the process 1500 returns to step 1510. Otherwise the process 1500 ends.

C. Move Instructions

Figure 16:
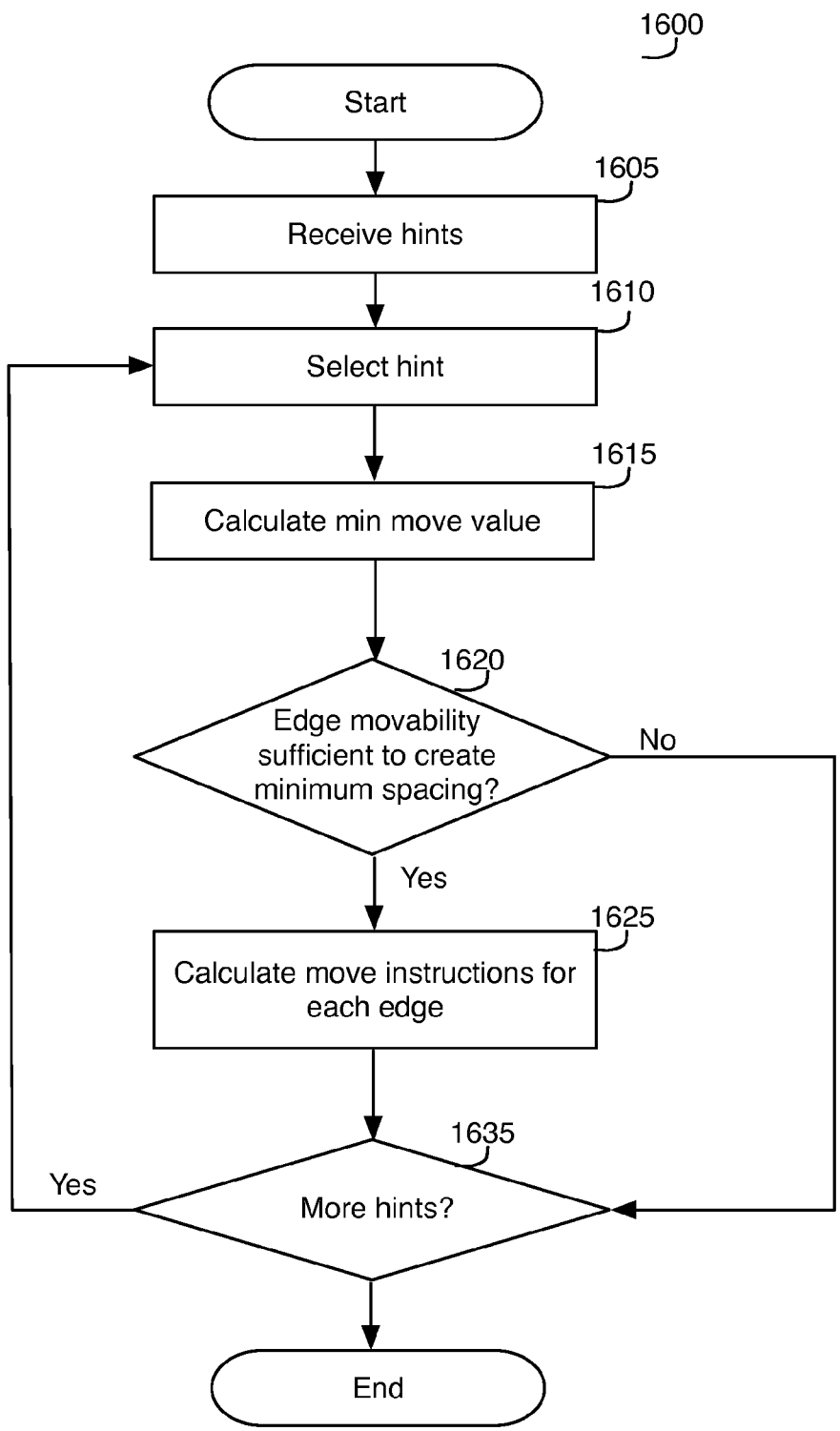
FIG. 16 conceptually illustrates a process of some embodiments for calculating move instructions for the hints of an odd loop.

FIG. 16 conceptually illustrates a process 1600 of some embodiments for calculating move instructions for the hints of an odd loop. Move instructions detail the recommended method for resolving hint error gaps. The move instructions may include the distance an edge should be moved as well as a direction. The process 1600 begins after the movability of the edges of each hint of an odd loop has been calculated by process 1500 of FIG. 15.

The process 1600 receives (at 1605) the hints for a particular odd loop which were calculated by process 1500. The process 1600 selects (at 1610) a first hint and calculates (at 1615) the minimum move value for the hint. The minimum move value for a hint is the minimum amount by which the edges of the hint need to be moved in order for the gap to be equal to the minimum same color spacing. The minimum move value may be calculated by an equation similar to:

Minimum move value=minimum color spacing−current gap width

In some embodiments, the minimum move value for complex hint error gaps may be calculated separately for each of the sub-gaps.

The process 1600 then determines (at 1620) whether the movability of the edges which make up the hint error gap is sufficient to create the minimum spacing necessary to resolve the hint error gap. In some embodiments, to determine whether there is sufficient movability, the process 1600 checks that each sub-gap in each hint error gap can be resolved. When the movability for a hint error gap or for one of the sub-gaps of a hint error gap is less than the minimum move value, then the hint error gap is not a readily resolvable hint error gap, so, in some embodiments, the process 1600 does not generate move instructions for the particular hint error gap and proceeds to 1635 described below. However, in other embodiments, the process 1600 may still generate move instructions for the particular hint error gap and indicate that the hint is a weak hint or assign a lower score in the hint prioritization step described below. When the movability is sufficient to create the minimum spacing necessary to resolve a hint error gap, then the process 1600 calculates (at 1625) the move instructions for each edge associated with the hint. In some embodiments, the move instructions for each edge and its facing edge (the edge on the other side of the gap) will be as close to half of the minimum move value as possible. When both movabilities are greater than half of the minimum move value, then both edges will have a move instruction for half of the minimum value. Otherwise, the edge with less than half of the minimum move value will have a move instruction for all of its movability, while the move instruction for the other edge will make up for the difference. For example, if the minimum move value is 0.01 µm, but edge 1 can only move by 0.003 µm and the facing edge 2 can move by 0.01 µm, edge 1 will have a move instruction for 0.003 µm and edge 2 will have a move instruction for the remaining 0.007 µm.

In other embodiments, distribution of the move instructions may be calculated differently. In some embodiments, the distribution may be calculated to evenly distribute the remaining movability of the edges. Using the same example where edge 1 can move 0.003 µm and edge 2 can move by 0.01 µm, edge 1 and edge 2 have a total of 0.013 µm movability, but only require 0.01 µm, leaving an extra 0.003 µm. Dividing this excess space between the two edges would generate a move instruction of 0.0015 µm for edge 1 and a move instruction of 0.0085 µm for edge 2. This would leave 0.0015 µm of movability for both edges after the move instructions have been executed.

In other embodiments, the move instructions may distribute the movability in a manner proportional to the movability of the edges. Using the same example, edge 1 would have a move instruction of ~77% (0.01 µm/0.013 µm) of the minimum move value and edge 2 would have a move instruction of ~23% (0.003 µm/0.013 µm) of the minimum move value. Since the minimum move value in this example is 0.01, edge 1 would have a move instruction ~0.0077 µm and edge 2 would have a move instruction ~0.0023 µm. In some embodiments, these move instructions are rounded to the nearest nm, and would result in move instructions of 8 nm and 2 nm respectively. In some embodiments these move instructions may be represented in a plain text format, indicating the vertices of a visual indication of the hint, as well as a direction and a distance to move the edge. In some embodiments, the instructions for a hint error gap's edges are stored in the following exemplary format:

(MOVE(EDGE 113 150 160 150) (DIRECTION NORTH 16))

(MOVE(EDGE 160 101 113 101) (DIRECTION SOUTH 16))

In this particular format, MOVE indicates that it is a move instruction. The EDGE portion indicates the coordinate location of the visual edge indicator. The coordinates may be the x and y coordinates of two ends of the edge. DIRECTION indicates the direction (NORTH and SOUTH) and distance (16 and 16 measured in nanometers) to move the particular edge. In some embodiments, the move instructions may use geographic directions (north, south, east and west) to indicate directions within the layer of the layout design, with north being at the top of the screen.

Different embodiments may use other methods for distributing the movability of the hint error gap edges and for storing the generated move instructions.

The process 1600 then determines (at 1635) whether there are any remaining hints for the odd loop. If there are, the process 1600 returns to 1610. Otherwise, the process 1600 ends.

Figure 17:
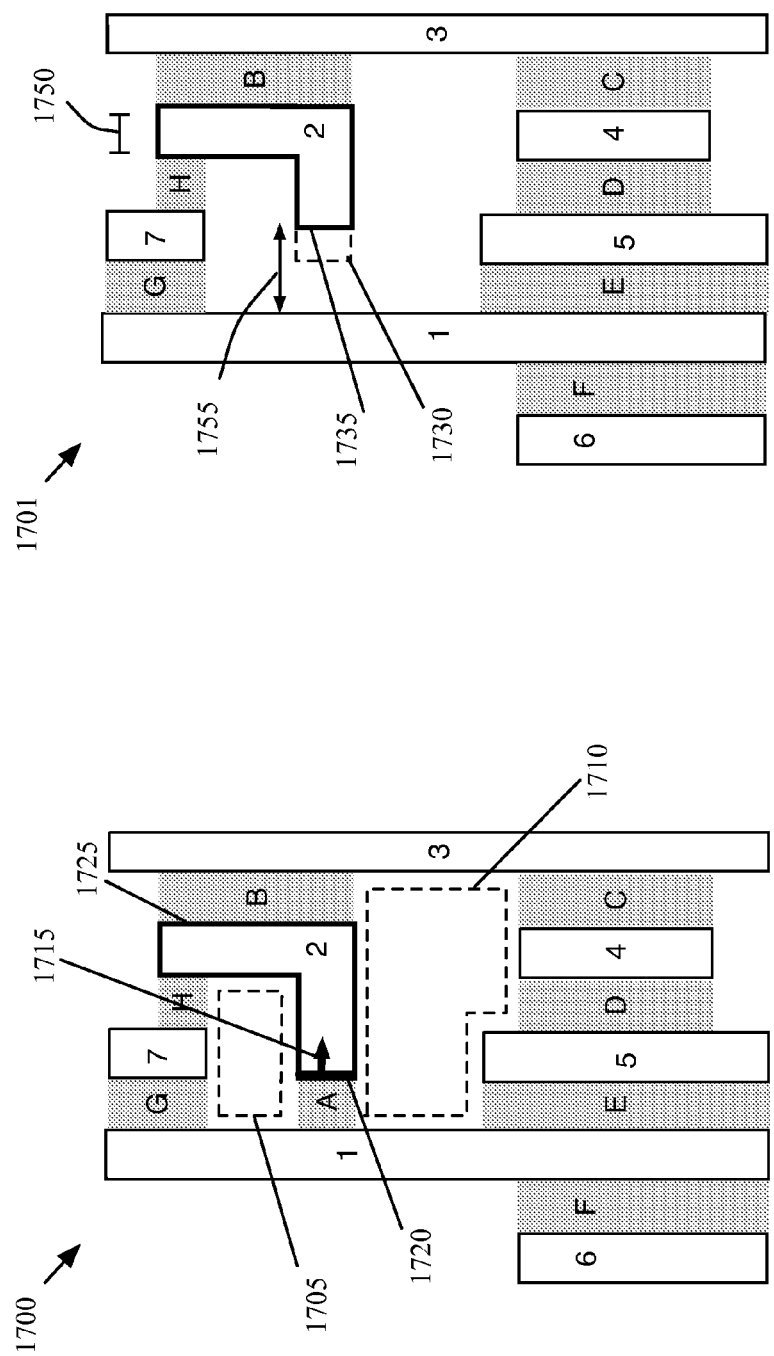
FIG. 17 illustrates an example of the resolution of an error gap in some embodiments.

FIG. 17 illustrates an example of the resolution of an error gap in some embodiments. FIG. 17 illustrates shapes 1-7, gaps A-H, odd loops 1705-1710, a move instruction 1715, and a movable edge 1720 in two stages 1700 and 1701. Stage 1700 focuses on edge 1720 with move instruction 1715 and its effect on odd loops 1705-1710.

Edge 1720 of shape 2 is a moveable edge, not because the entire shape is moveable, but because the edge 1720 and the opposing edge 1725 are more than the minimum shape width 1750 apart. In this case, the edge 1720, can be moved away from gap A in order to resolve the gap which means gap A is a feasible error gap.

The second stage 1701 illustrates the shapes and gaps after the move instruction 1715 has been applied to edge 1720. The second stage shows that the horizontal leg of shape 2 has been shortened by moving the edge 1720 from its original location 1730 indicated by a dashed line to its new location 1735. The new location 1735 creates a new gap 1755 which is greater than the minimum same color spacing for the design layout, resolving the error gap between shapes 1 and 2 to break the odd loops 1705 and 1720. This creates a new non-error loop with shapes 1-5 and 7.

D. Hint Prioritization

Figure 18:
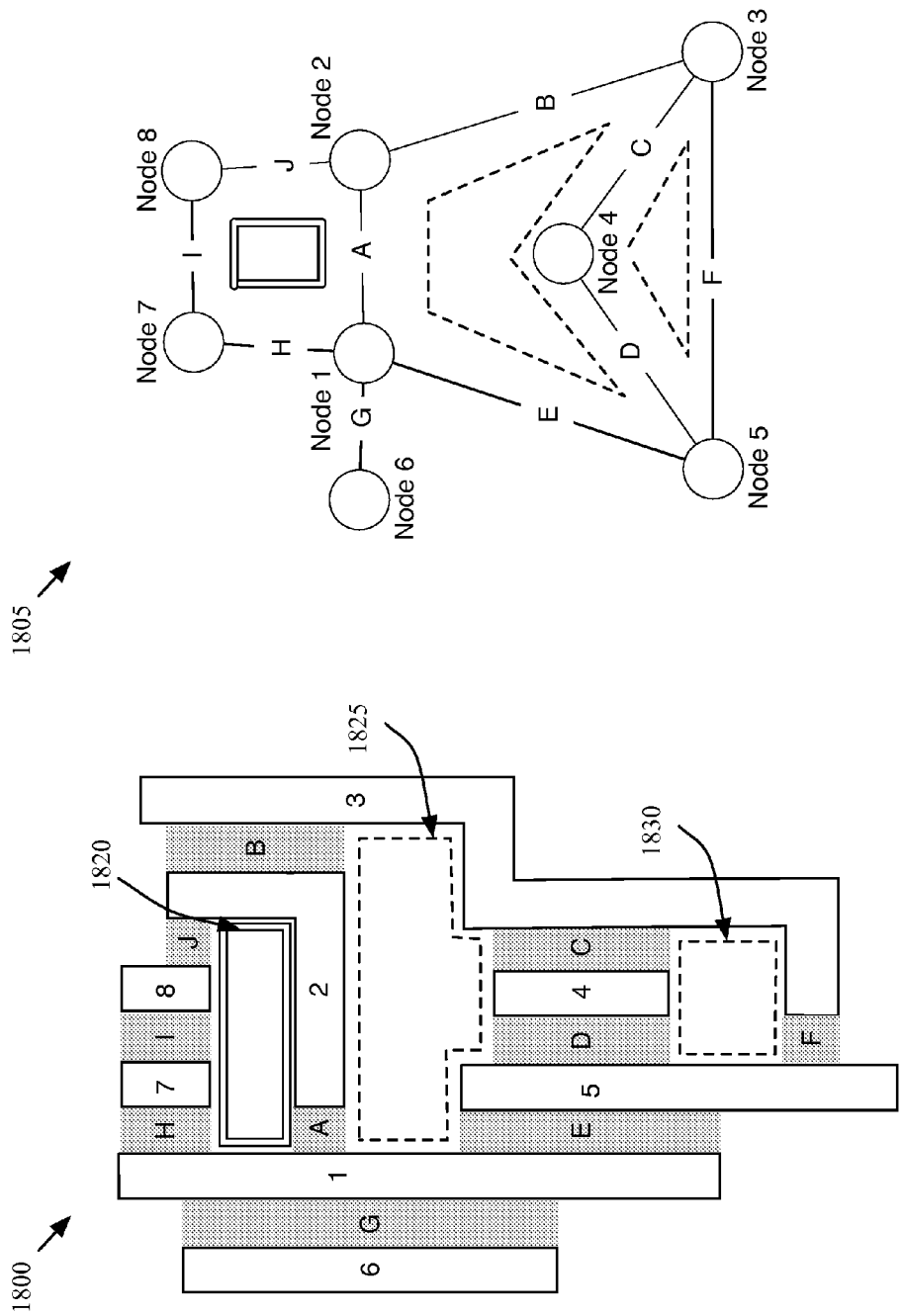
FIG. 18 illustrates several different hint types.
Figure 19:
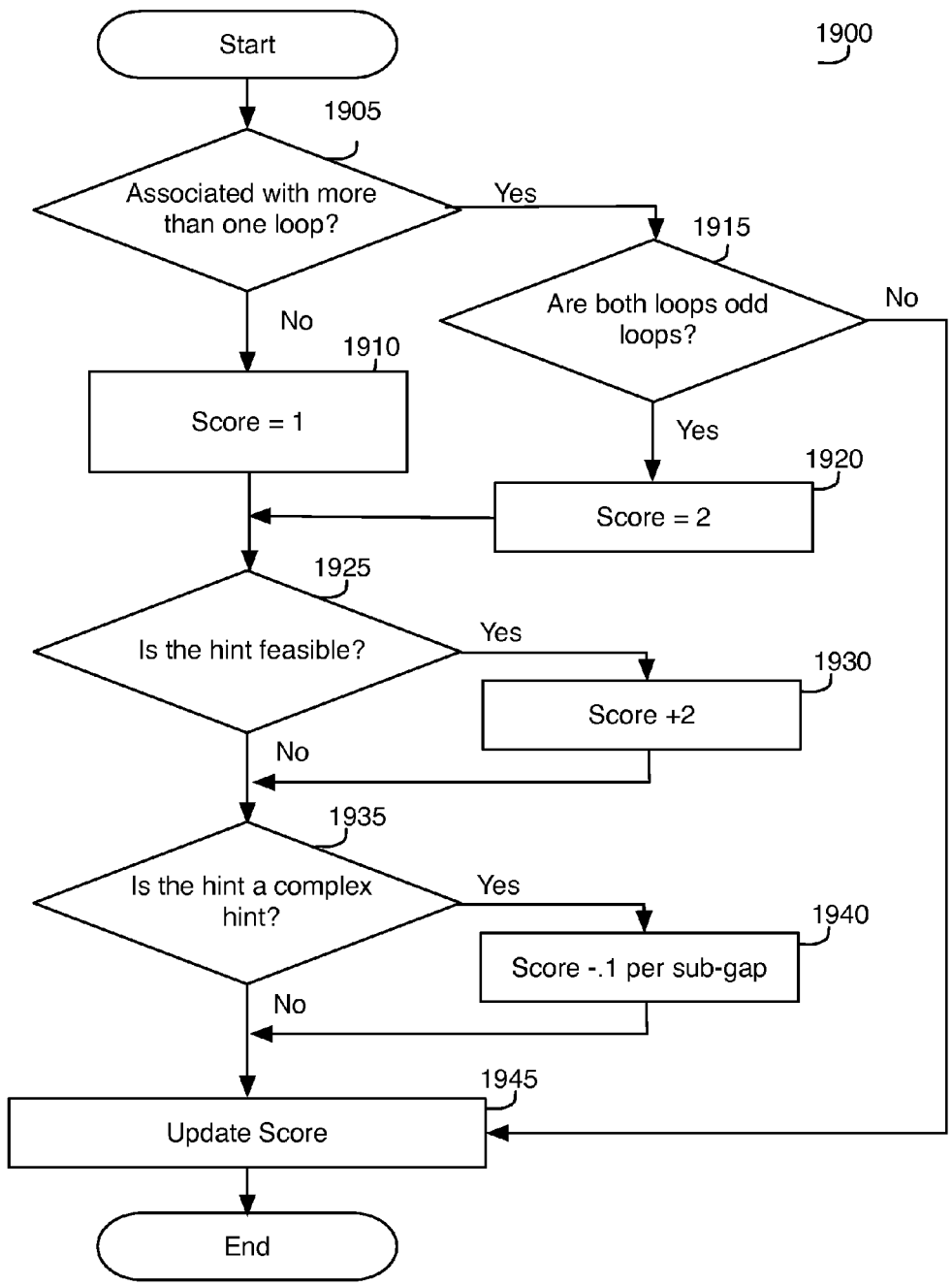
FIG. 19 conceptually illustrates the process of some embodiments to assign scores to different error gaps of an odd loop.

The prioritization of different types of error gaps of some embodiments will be described with reference to FIGS. 18 and 19. FIG. 18 uses the example shape layout 1800 to illustrate several different hint types determined through the process 1900 described in FIG. 19. FIG. 18 shows the shapes, gaps and loops described with reference to FIG. 10. The hints of loop 1825 will be evaluated for this example. FIG. 19 conceptually illustrates the process some embodiments perform to assign scores to different error gaps of an odd loop.

The process 1900 determines (at 1905) whether an error gap is associated with more than one loop. In this example, gaps A, C and D are associated with multiple loops. Gap A is associated with non-odd loop 1820 and odd loop 1825, while gaps C and D are associated with odd loops 1825 and 1830.

When the process 1900 determines (at 1905) that the gap is not associated with more than one loop, then the process in some embodiments assigns (at 1910) a base score of 1 which represents that resolving the hint will break the odd loop. In this example, gaps B and E would both be assigned a base score of 1 because resolving either of those gaps would break odd loop 1825.

When the process 1900 determines (at 1905) that the gap is associated with more than one loop, the process 1900 determines (at 1915) whether both loops are odd loops. As noted above, in this example, loop 1820 associated with gap A is not an odd loop, while both loops 1825 and 1830 for gaps C and D are odd loops. In the case that one of the loops is not an odd loop, as is the case for gap A, the gap is not a hint and the process 1900 proceeds to 1935 described below. In some embodiments, a score of zero or null may be assigned to an error gap when the gap is not a hint.

When the process 1900 determines (at 1915) that both loops are odd loops, the process 1900 in some embodiments assigns (at 1920) a base score of 2, indicating that resolving this error gap would be particularly effective because it would resolve two error loops. In this example, resolving either gap C or D would break not only odd loop 1825, but odd loop 1830 as well. Resolving either of these error gaps would create a single non-odd loop consisting of shapes 1-3 and 5, with shape 4 now being printable on the same mask as either shape 3 if gap C is broken or shape 5 if gap D is broken.

Once a base score has been determined (at 1910 and 1920), the process 1900 then determines (at 1925) whether the hint is feasible. As noted above, a hint is feasible if the total movability of the edges of the hint is at least enough to expand the hint to the minimum same color spacing distance. In the case of a complex hint, the hint is only feasible if all of the sub-gaps have enough movability in their edges to expand every sub-gap to the minimum same color spacing distance. When the hint is not feasible, its error gap will not be easily resolved and will not be considered a strong hint. When the process 1900 determines (at 1925) that the hint is feasible, the process 1900 proceeds to 1935 with the base score indicating that it is a hint, but not a strong one.

In this example, gaps D and E are such weak hints. Gap D, as noted above has a base score of 2, but the edges on either side of the shape are not readily movable. Both shapes 4 and 5 are already at the minimum shape width and gaps C and D which face the opposing edges are both already at the minimum spacing for the design layout. With no room to move, the error gap for hint D is not readily resolvable and will be assigned its base score of 2. In the case of gap E, the reasoning is similar. Shapes 5 and 1 are already at their minimum width and gaps G and D facing the opposing edges are already at their minimum spacing. The error gap for hint E is not readily resolvable and will be assigned its base score of 1.

When the process 1900 determines (at 1925) that the hint is feasible, however, the score is incremented (at 1930) by 2 in some embodiments, assuring that it will be considered a strong hint (a hint with a score greater than or equal to 3). In this example, hints B and C are both examples of strong hints. In both cases, shape 3 is movable away from the error gaps, allowing the hints to be resolved and the odd loops broken. Hint B because it had a base score of 1, will be assigned a score of 3, while hint C with a base score of 2 will be assigned a score of 4.

At 1935, the process 1900 determines whether the hint is a complex hint (a hint which has an error gap with multiple sub-gaps). In some embodiments, complex hints are given lower priority scores because multiple sub-gaps increase the complexity of resolving the hint. However, since the hints are feasible, they are still meaningful hints and may be more useful than a hint with no movable edges. If the hint is a complex hint, the process 1900 may subtract (1940) a portion (0.1) from the score, to indicate that it is a lower priority than a simple hint with the same score.

At 1945, the final scores are assigned to each hint, or in the case that no score or a zero score is assigned, the error gap is determined not to be a hint. Assigning the scores, in some embodiments, will include storing the score in a data storage for future use (e.g., to display to the user or to prioritize the hints). The process 1900 then ends.

In some embodiments, the scores assigned may have different values or ranges and may account for additional factors. For instance, in some embodiments, rather than a binary decision of whether a hint is feasible, the process may assign higher scores to shapes which have a lot of room to move versus shapes which only meet the minimum spacing requirements. One skilled in the art will understand that many different methods may be used for scoring hints.

Figure 20:
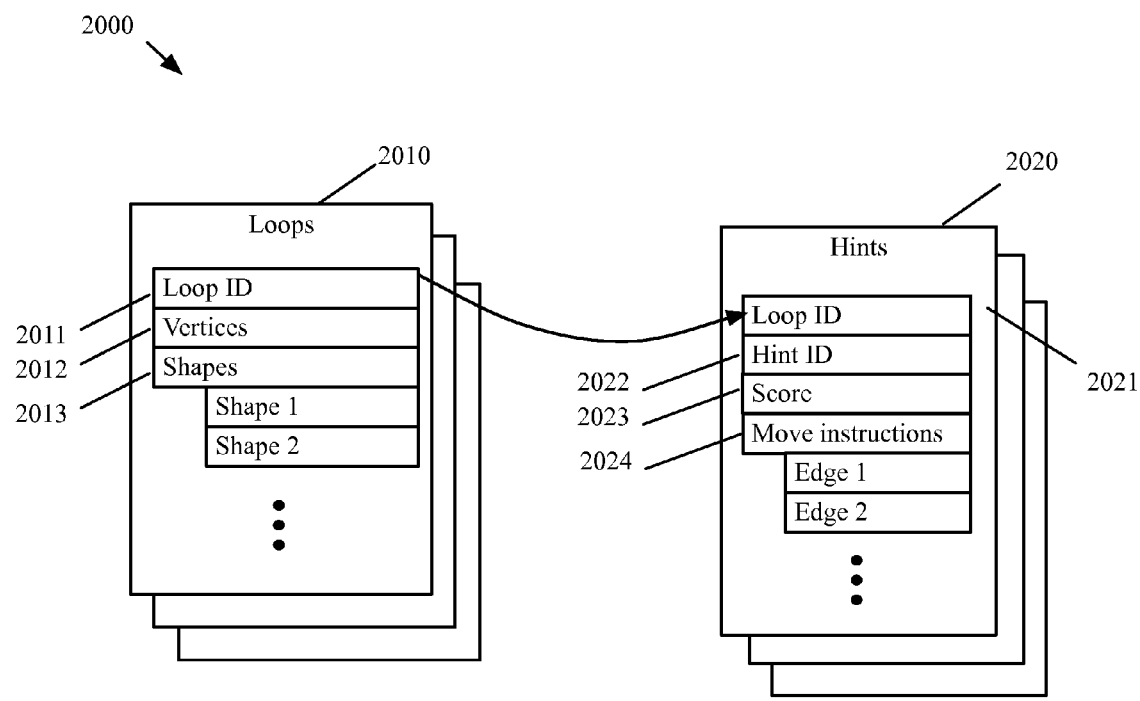
FIG. 20 illustrates a data structure used to store the loops and hints of some embodiments.

FIG. 20 conceptually illustrates the data structure 2000 used to store the loops and hints of some embodiments. Table 2010 stores information regarding the loops and table 2020 stores information regarding the hints. The loops table 2010 has fields loop ID 2011, vertices 2012 and shapes 2013. The hints table 2020 has fields loop ID 2021, hint ID 2022, a score 2023, and move instructions 2024. These two tables have a one-to-many relationship and are linked by a common loop ID, with multiple hints being associated with each single loop. In the case that two loops share an error gap, a separate hint will be generated for each loop in some embodiments. In other embodiments, only one hint would be generated and the relationship between the tables would be a many-to-many relationship, with each loop having multiple hints and each hint potentially being a part of multiple loops.

The loops table 2010 may contain information related to the shapes 2013 that make up the loops. The loops table 2010 may also include display information such as vertices 2012 describing the coordinate location of the loop within the layout or shape information describing the shapes which make up the loop.

The hints table 2020 may use the loop ID to identify the loop or loops with which the hint is associated. The hint ID would be a unique ID to identify each hint. The score 2023 contains the score calculated according to process 1900 in some embodiments. The move instructions 2024 contain the move instructions generated by process 1600 and described above in some embodiments. The move instructions may include a direction, a distance to move and a location for the move instruction.

II. User Interface

Figure 21:
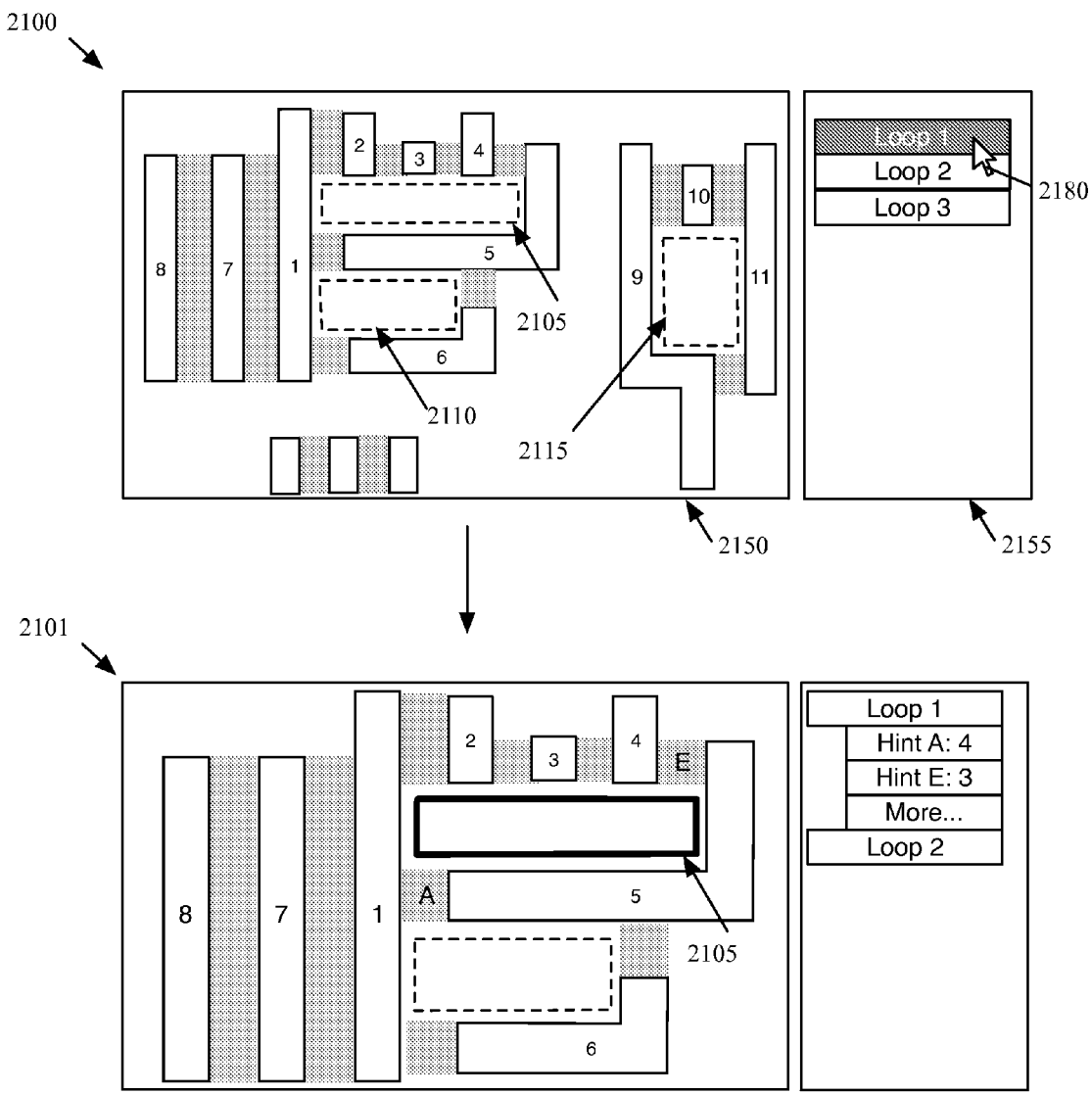
FIG. 21 illustrates a zooming function within the graphical user interface (GUI) of the invention of some embodiments.

FIG. 21 illustrates in two stages 2100 and 2101 a zooming function within the graphical user interface (GUI) of the invention of some embodiments. The first stage 2100 illustrates a first display area 2150 of the EDA application of some embodiments and a second display area 2155 which displays a listing of the loops and hints currently displayed. The first display area 2150 displays a layout which includes shapes 1-11 and odd loops 2105-2115. The second display area displays a cursor 2180 and a selectable listing of the loops 2105-2115 displayed in the first display area. The cursor 2180 is used to select Loop 1 in the second display area.

In the second stage 2101, the odd loop 1 has now been highlighted in the first display area 2150. In addition, the first display area 2150 has been zoomed into the area around loop 1. The selectable listing in the second display 2155 has also been expanded to show the hints associated with the selected loop 2105. In some embodiments, when the loop 2105 is selected in the first stage 2100, the highest prioritized score for the loop 2105 will automatically be selected and displayed in the first display area 2150.

Figure 22:
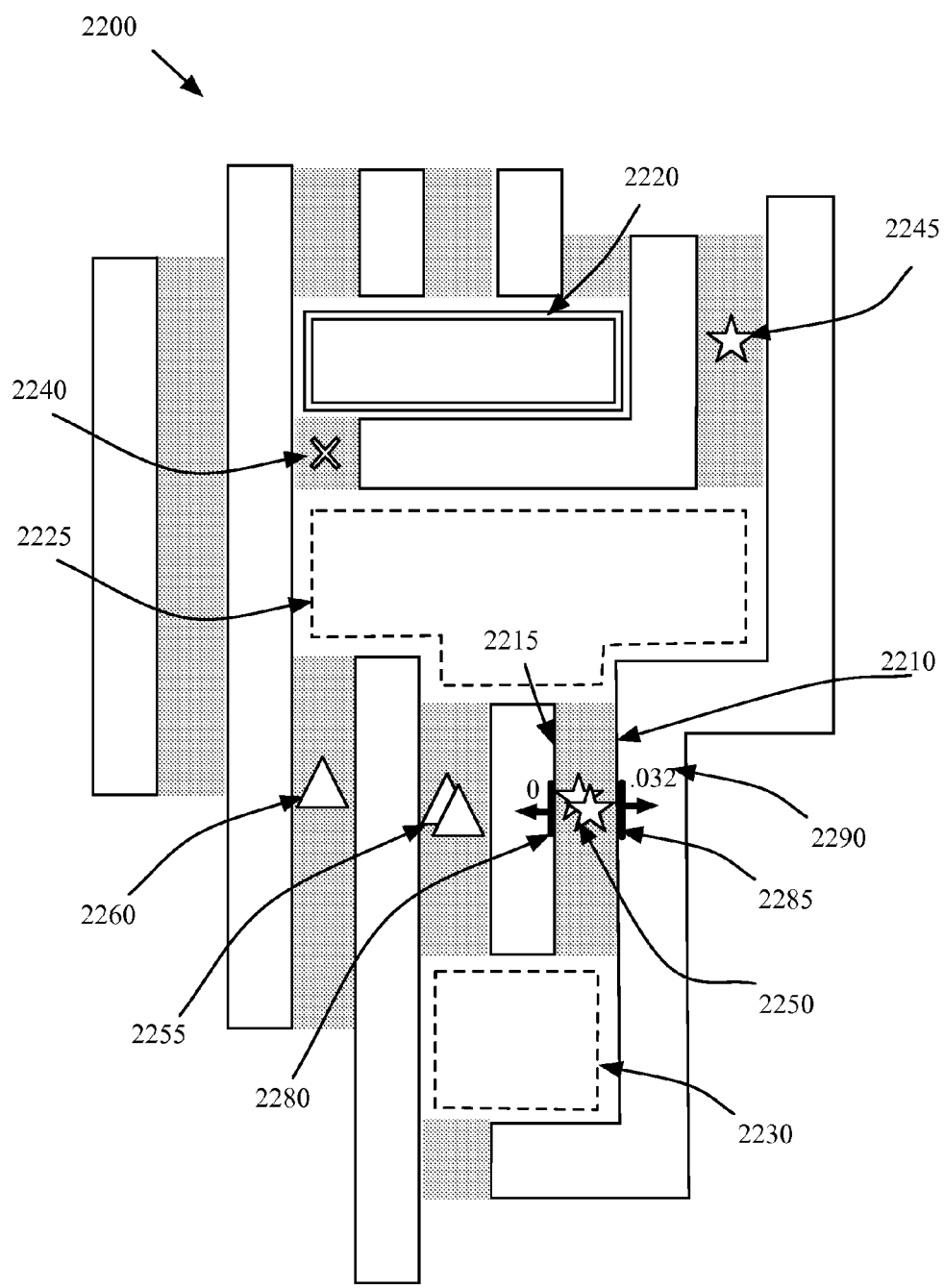
FIG. 22 illustrates different hints of different embodiments of the invention.

FIG. 22 illustrates different representations of hints of different embodiments of the invention. The layout 2200 includes shapes, gaps and loops 2220-2230 similar to previous figures. Layout 2200 also includes visual gap indicators 2240-2260 and hint indicators 2280-2285. The various visual gap indicators 2240-2260 indicate the different priorities or scores of the different hints throughout the layout in some embodiments.

In this example, an X 2240 is used to indicate a non-hint. Triangles may indicate weak hints. A single triangle 2260 indicates a hint with a score of 1 because it is an infeasible hint which would resolve a single odd loop 2225. A double triangle 2255 indicates a score of 2 because it is an infeasible hint, but if the error gap could be resolved it would solve two odd loops 2225 and 2230. Stars may be used to indicate strong hints. A single star 2245 indicates a score of 3 because it is a feasible hint which will break the odd loop 2225. A double star 2250 indicates a score of 4 because it is a feasible hint which will break two odd loops 2225 and 2230.

Hint indicators 2280-2285 may be used conjunctively or alternatively to indicate hints in some embodiments. These hint indicators 2280-2285 may indicate the edge which should be moved, the direction in which to move it, as well as the distance which it needs to be moved, as shown with text 2290. In this example, hint indicator 2285 provides an instruction to move the edge 2210 by 0.32 to the right. Hint indicator 2280 indicates that edge 2215 would be moved to the left, but because it is a non-movable edge, the recommended move is by 0 to the left. The distance to be moved may be calculated as part of the move instructions described above.

In some embodiments, the various visual indicators 2240-2290 may use different shapes, colors or other visual indications of the different priorities or scores. In some embodiments, the hints may not have any visual indicators. The visual indicators may be shown for a single loop or for an entire layer.

Figure 23:
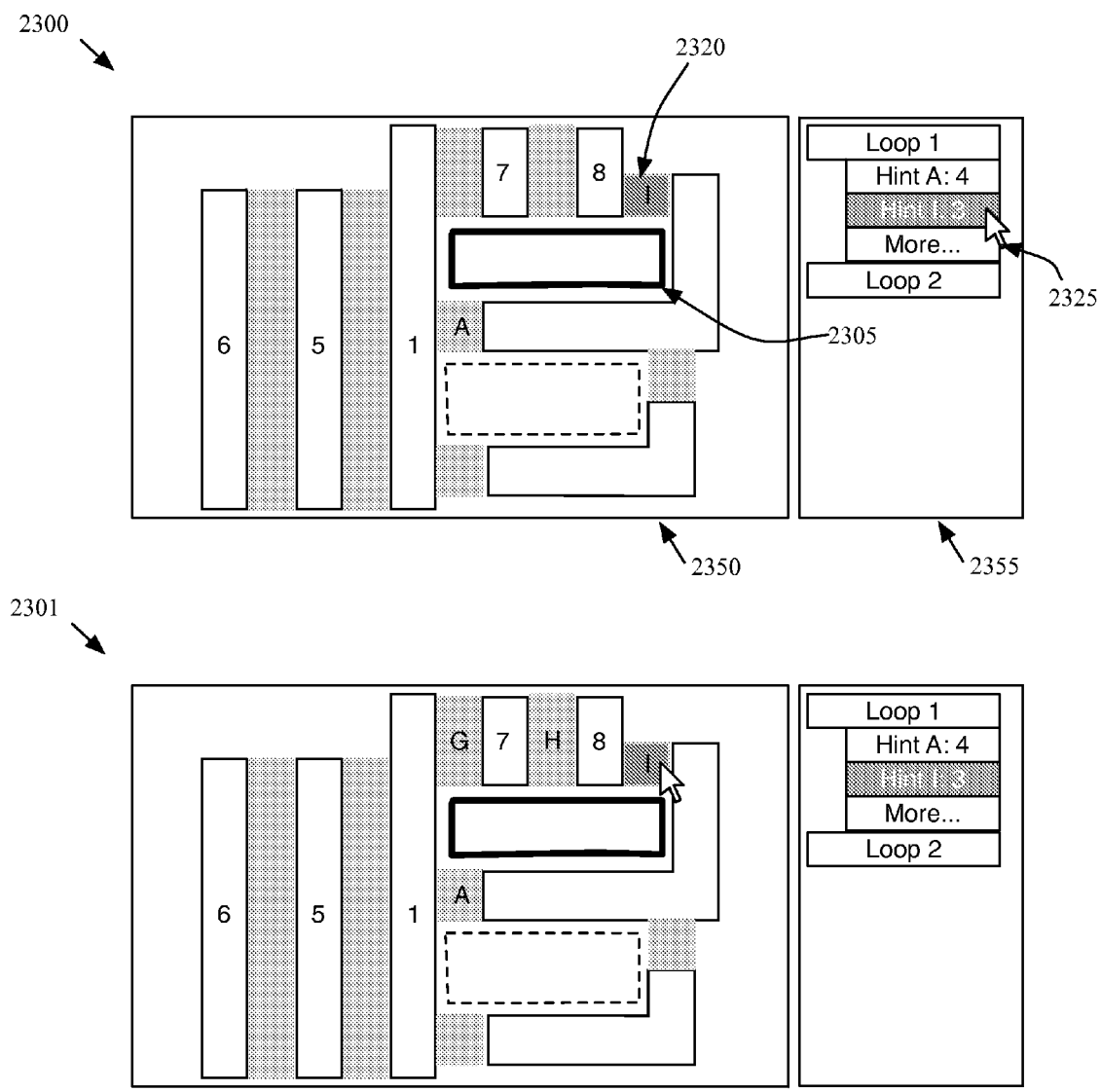
FIG. 23 illustrates another view of the GUI of the invention of some embodiments, showing alternative methods of selecting hints and indicating them on the display.

FIG. 23 illustrates another view of the GUI of the invention of some embodiments, showing alternative methods of selecting hints and indicating them on the display. In the first case 2300, the user may select the hint 2325 in the second display area 2355. Selection of a hint 2325 in the second display may highlight the hint 2320 in the first display area. In the second case 2301, the user selects a potential problem area 2320 in the main display. Selection of the potential problem area 2320 may highlight the hint 2325 in the list of the second display area 2355, allowing a user to see how the application has prioritized that particular gap in the odd loop. In some embodiments, either of these selections will also display additional information in a third display area.

Figure 24A:
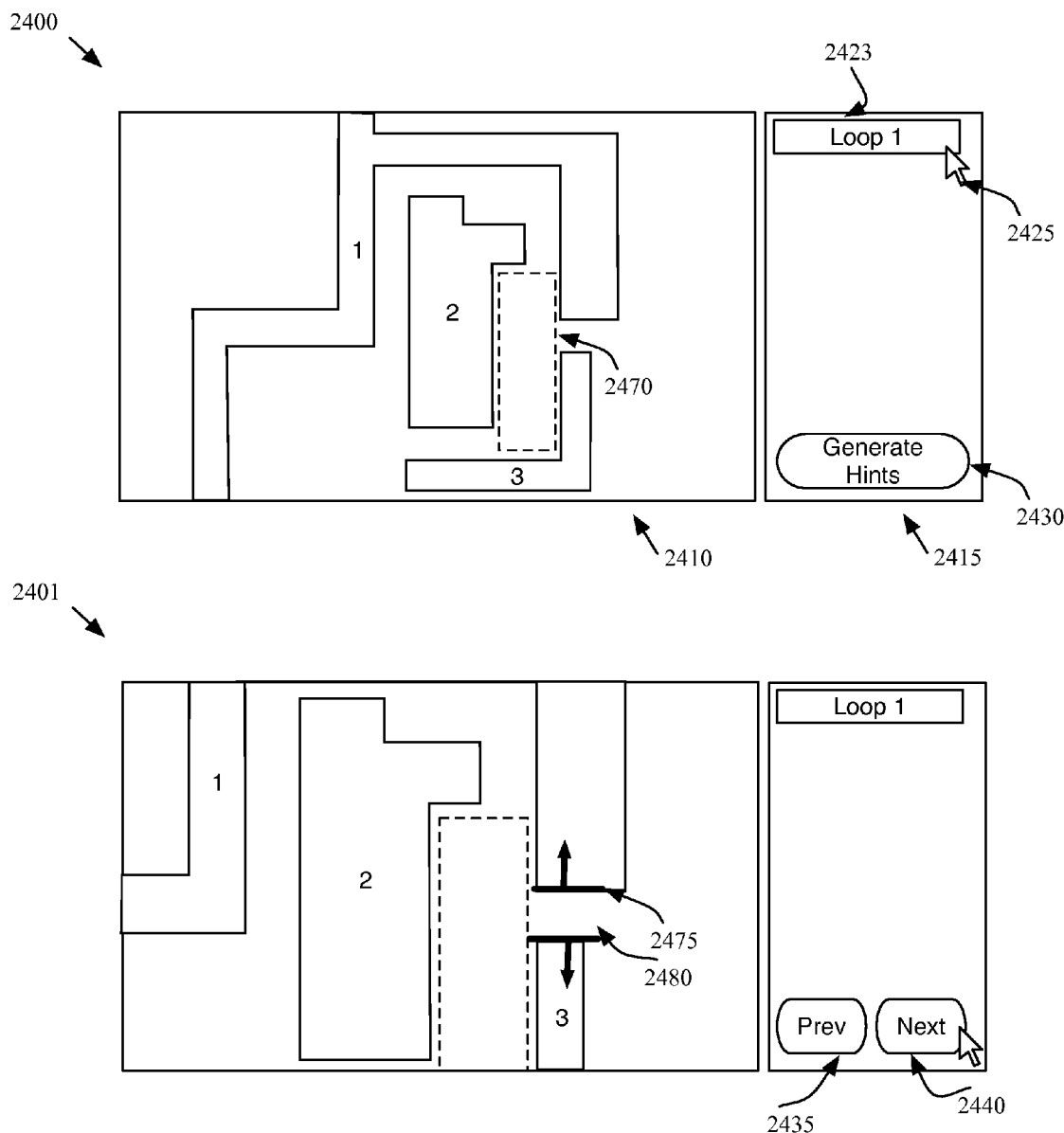
FIGS. 24A and 24B illustrate the GUI of the invention of some embodiments showing complex hints and hint selection.
Figure 24B:
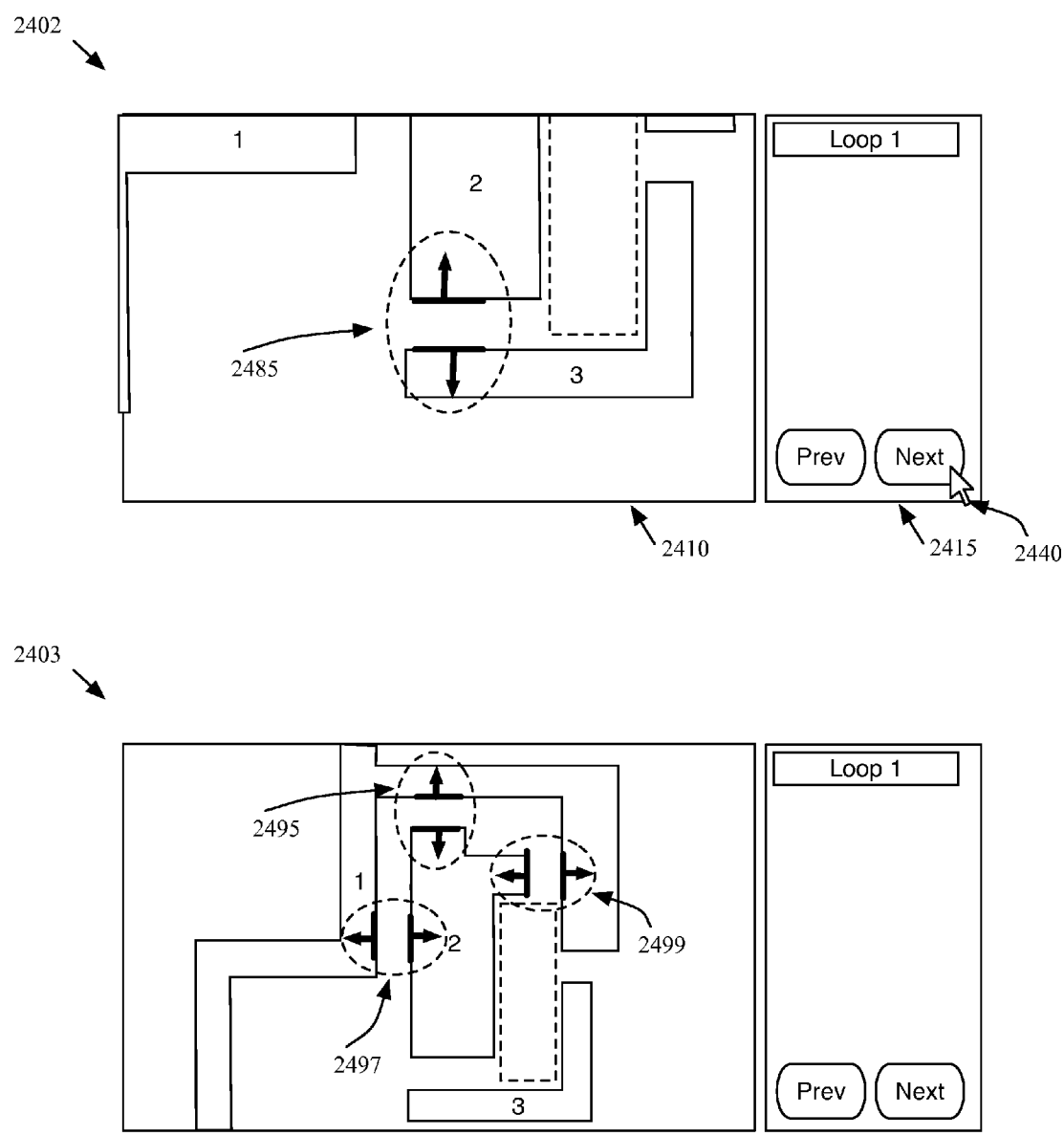

FIGS. 24A-B illustrates the GUI of the invention of some embodiments showing complex hints and hint selection. View 2400 illustrates the GUI after an error loop listing 2423 has been selected in the secondary display area 2415 using the selection tool 2425. The error loop 2470 is then displayed in the first display area 2410 and, in some embodiments, a button 2430 is displayed in the second area to allow for the generation of hints.

When the button 2430 is selected, view 2401 displays a hint with the highest priority. The first hint in this example is represented by two movement markers 2475-2480 indicating the edges and the directions in which the edges should be moved. The display area also shows a zoomed in view of the layout, focusing on the selected hint. In some embodiments, the markers 2475-2480 would also include distance indicators which would indicate how far each edge should be moved. Once the hints have been generated, the button 2430 may be replaced by other buttons 2435-2440 to allow for navigating the hints of the selected error loop.

View 2402 shows that when the Next button 2440 is selected, the next hint 2485 is displayed in the first display area 2410. View 2403 shows that when a complex hint is selected, multiple hint markers 2495-2499 will be displayed simultaneously in some embodiments, providing the user with useful guidelines for resolving error loops. To display all of the hint markers simultaneously, the GUI has zoomed back out from the design layout.

Figure 25:
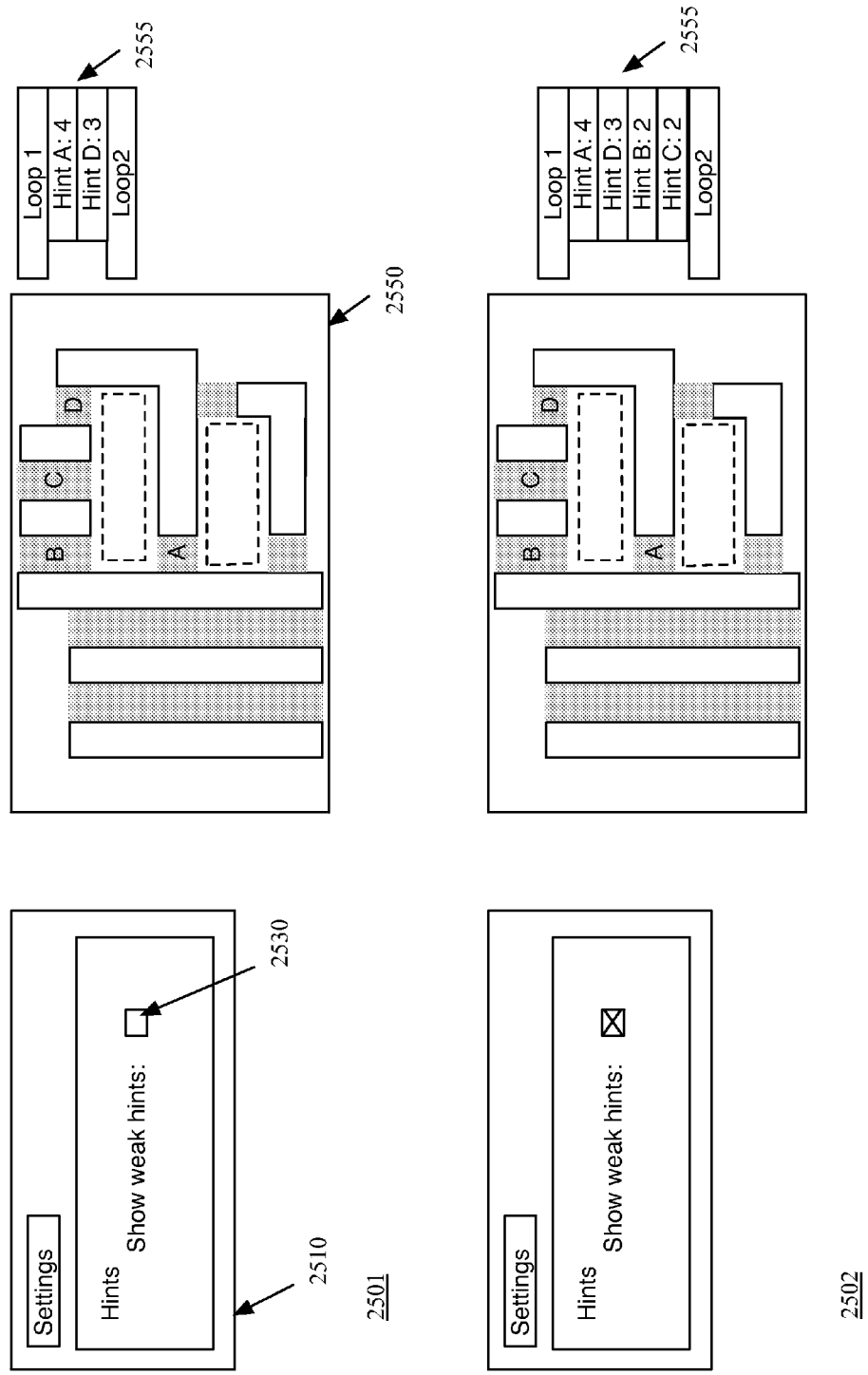
FIG. 25 illustrates a GUI of the invention of some embodiments showing the settings screen for displaying hints in the display.

FIG. 25 illustrates a GUI of the invention of some embodiments showing the settings screen for displaying hints in the display. View 2501 illustrates a settings screen 2510 and a first and second display areas 2550-2555. The settings screen includes a checkbox 2530 for hints, allowing the user to display weak hints. The display area 2550 illustrates four hints A-D. The second display area 2555 displays a selectable listing of the loops and associated hints displayed in the first display area 2550.

The setting 2530 to show weak hints may be one of many different settings in the settings screen 2510. In the first case 2501, the checkbox 2530 is shown as unchecked, which is the default setting in some embodiments. In some embodiments, a hint is classified as a weak hint when the score calculated for that hint is less than 3. When the checkbox 2530 is unchecked, only hints A and D are shown because they are both at level 3 or above. The hints A and D are also ordered according to the scores calculated for each hint.

In the second case 2502, when checkbox 2530 is checked, the second display area now displays, in addition to hints A and D, hints B and C which are weak level 2 hints. Checking the checkbox 2530 in the settings window allows the user to change the universal settings throughout the program. As the user selects other loops, both strong and weak hints will be displayed for each hint in the loops.

Figure 26:
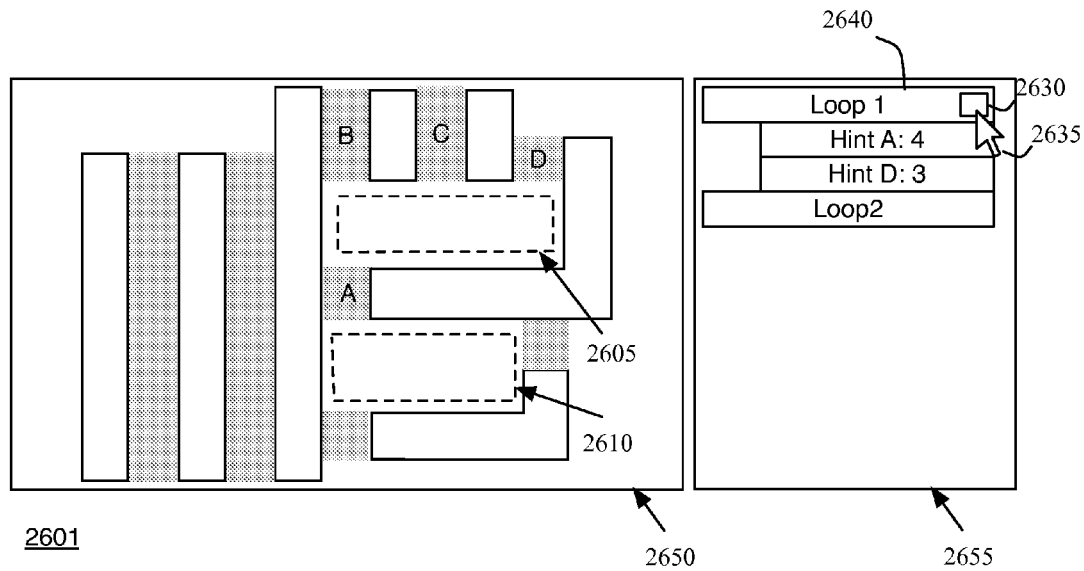
FIG. 26 illustrates an alternative method of the GUI for changing the level of displayed hints within the display.
Figure 26:
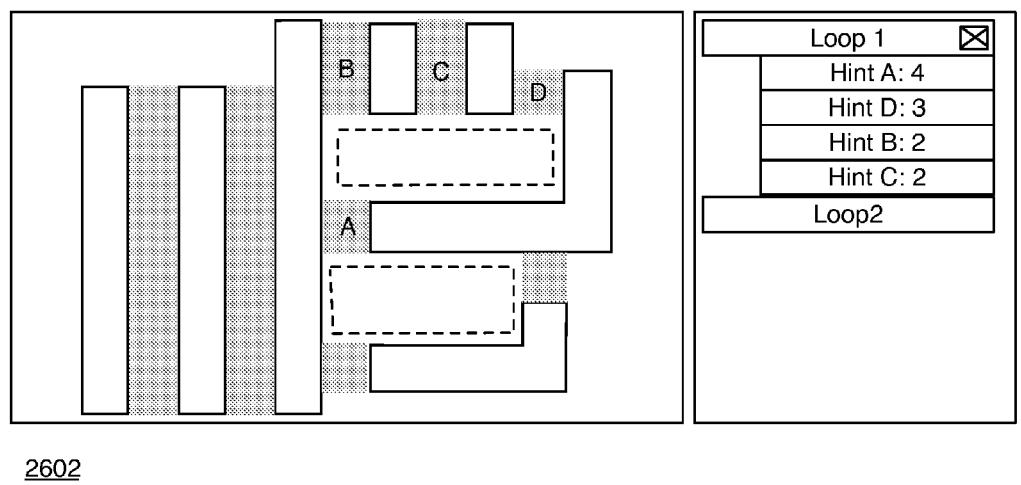

FIG. 26 illustrates an alternative method of the GUI for changing the level of displayed hints within the display. FIG. 26 illustrates a first stage 2601 with a first display area 2650 and a second display area 2655. The second display area illustrates a selectable listing 2640 of the loops and hints displayed in the first display area. Unlike FIG. 25, the selectable listing also includes a checkbox 2630.

In some cases, rather than going into a global settings for the application, a user may only want to see the lower level hints for a particular loop. The first stage 2601 illustrates the user using the cursor 2635 to select the checkbox 2630. As illustrated in the second stage 2602, when the checkbox 2630 is checked, weak hints may be displayed for the particular selected loop.

III. Electronic System

Figure 27:
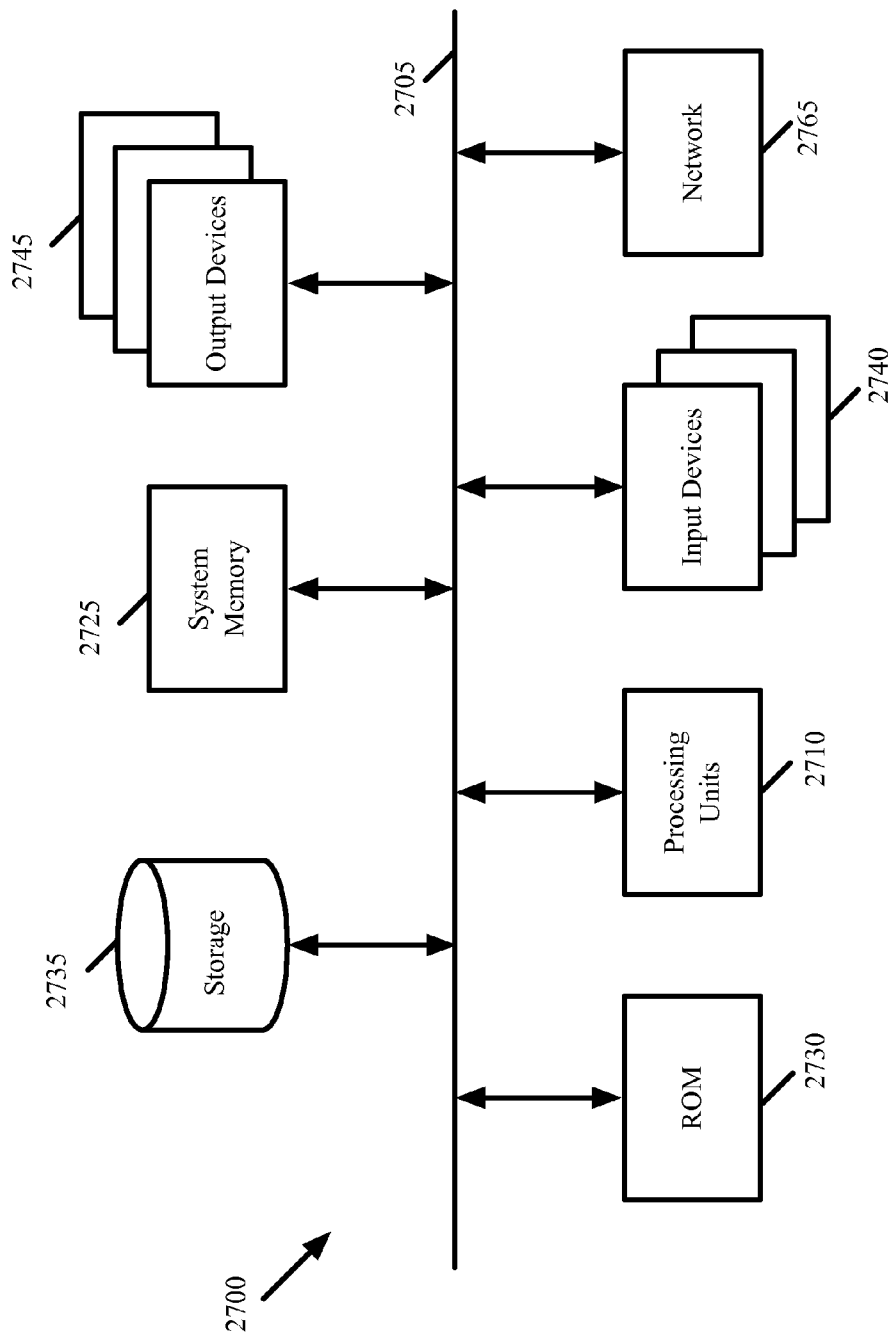
FIG. 27 conceptually illustrates an electronic system with which some embodiments of the invention are implemented.

FIG. 27 conceptually illustrates an electronic system 2700 with which some embodiments of the invention are implemented. The electronic system 2700 can be used to execute any of the control, virtualization, or operating system applications described above. The electronic system 2700 may be a computer (e.g., a desktop computer, personal computer, tablet computer, server computer, mainframe, a blade computer etc.), phone, PDA, or any other sort of electronic device. Such an electronic system includes various types of computer readable media and interfaces for various other types of computer readable media. Electronic system 2700 includes a bus 2705, processing unit(s) 2710, a system memory 2725, a read-only memory 2730, a permanent storage device 2735, input devices 2740, and output devices 2745.

The bus 2705 collectively represents all system, peripheral, and chipset buses that communicatively connect the numerous internal devices of the electronic system 2700. For instance, the bus 2705 communicatively connects the processing unit(s) 2710 with the read-only memory 2730, the system memory 2725, and the permanent storage device 2735.

From these various memory units, the processing unit(s) 2710 retrieve instructions to execute and data to process in order to execute the processes of the invention. The processing unit(s) may be a single processor or a multi-core processor in different embodiments.

The read-only-memory (ROM) 2730 stores static data and instructions that are needed by the processing unit(s) 2710 and other modules of the electronic system. The permanent storage device 2735, on the other hand, is a read-and-write memory device. This device is a non-volatile memory unit that stores instructions and data even when the electronic system 2700 is off. Some embodiments of the invention use a mass-storage device (such as a magnetic or optical disk and its corresponding disk drive) as the permanent storage device 2735.

Other embodiments use a removable storage device (such as a floppy disk, flash drive, etc.) as the permanent storage device. Like the permanent storage device 2735, the system memory 2725 is a read-and-write memory device. However, unlike storage device 2735, the system memory is a volatile read-and-write memory, such a random access memory. The system memory stores some of the instructions and data that the processor needs at runtime. In some embodiments, the invention's processes are stored in the system memory 2725, the permanent storage device 2735, and/or the read-only memory 2730. From these various memory units, the processing unit(s) 2710 retrieve instructions to execute and data to process in order to execute the processes of some embodiments.

The bus 2705 also connects to the input and output devices 2740 and 2745. The input devices enable the user to communicate information and select commands to the electronic system. The input devices 2740 include alphanumeric keyboards and pointing devices (also called "cursor control devices"). The output devices 2745 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 27, bus 2705 also couples electronic system 2700 to a network 2765 through a network adapter (not shown). In this manner, the computer can be a part of a network of computers (such as a local area network ("LAN"), a wide area network ("WAN"), or an Intranet, or a network of networks, such as the Internet. Any or all components of electronic system 2700 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. For example, while the examples shown illustrate splitting one or more shapes of a design layout region into two exposures, one of ordinary skill in the art would recognize that some embodiments would use similar processes to split shapes of a design layout region into more than two (e.g., three, four, etc.) exposures. One of ordinary skill in the art will also recognize that in some instances above, when referring to assigning shapes or portions of shapes to multiple exposures, the shapes (or portions thereof) are actually assigned to multiple mask layouts that are used to create multiple masks that enable a design layout layer to be printed in multiple exposures. Similarly, one of ordinary skill would recognize that while many instances above refer to "drawing" a graph, some embodiments do not actually draw the visible graph, but instead define the graph as a data structure.

In addition, a number of the figures (including FIGS. 9, 12, 15, 16, and 19) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details.

What is claimed is:

1. A system for displaying design solutions to odd loops, each odd loop comprising a plurality of shapes that cannot be printed according to design constraints in a dual patterning printing process for a layer of a circuit design layout, the system comprising:
    a design violation identifier for identifying an odd loop comprising a set of shapes and a plurality of gaps between opposing edges of neighboring shapes in the odd loop;
    a design solution generator for (i) identifying, for each gap of the plurality of gaps, a movability of the corresponding pair of opposing shape edges, wherein the movability is a distance that the pair of opposing shape edges can be moved apart from each other without violating design constraints and (ii) generating a set of design solutions for the odd loop identified by the design violation identifier, each design solution for indicating a set of gaps that can be modified such that the set of shapes of the odd loop can be printed without violating the design constraints;
    a design solution analyzer for categorizing the design solutions based on a level of difficulty in applying each design solution to the circuit design layout, wherein the level of difficulty is based on the movability of the pair of opposing shape edges for each gap in the set of gaps of each design solution; and
    a design solution displayer for displaying a visual indication for each design solution based on the category of the design solution.

2. The system of claim 1, wherein the movability of a pair of opposing shape edges includes a distance that the shapes comprising the opposing shape edges can be moved away from each other without moving any other shape.

3. The system of claim 1, wherein the movability of a shape edge includes a distance that the shape edge can be moved without moving the shape edge's shape and without violating a design constraint.

4. The system of claim 1, wherein the visual indication is different for different categories of design solutions.

5. The system of claim 1, wherein the visual indication indicates an amount of movability of the pair of opposing shape edges for each gap of the set of gaps in each design solution.

6. The system of claim 1, wherein the design solution analyzer is further for:
    specifying a first level of difficulty for a first design solution when the movability of the pair of opposing shape edges for each gap of the first design solution is sufficient to create a threshold distance between the pair of opposing shape edges; and
    specifying a second level of difficulty for a second design solution when the movability of the pair of opposing shape edges for each gap of the second design solution is not sufficient to create the threshold distance, wherein the first design solution is categorized as having a lower level of difficulty than the second design solution.

7. A method for displaying design solutions to odd loops, each odd loop comprising a plurality of shapes that cannot be printed according to design constraints in a dual patterning printing process for a layer of a circuit design layout, the method comprising:
    identifying, by a computer, an odd loop comprising a set of shapes and a plurality of gaps between opposing edges of neighboring shapes in the odd loop;
    for each gap of the plurality of gaps, identifying a movability of the corresponding pair of opposing shape edges, wherein the movability is a distance that the pair of opposing shape edges can be moved apart from each other without violating design constraints;
    generating a set of design solutions for the identified odd loop, each design solution for indicating a set of gaps that can be modified such that the set of shapes of the odd loop can be printed without violating the design constraints;
    categorizing the design solutions based on a level of difficulty in applying each design solution to the circuit design layout, wherein the level of difficulty is based on the movability of the pair of opposing shape edges for each gap in the set of gaps of each design solution; and
    displaying a visual indication for each design solution based on the category of the design solution.

8. The method of claim 7, wherein the movability of the pair of opposing shape edges includes a distance that the shapes comprising the opposing shape edges can be moved away from each other without moving any other shape.

9. The method of claim 7, wherein the movability of the pair of opposing shape edges includes a distance that each shape edge of the pair of opposing shape edges can be moved without moving the shape edge's shape and without violating a design constraint.

10. The method of claim 7, wherein the visual indication is different for different categories of design solutions.

11. The method of claim 7, wherein the visual indication indicates an amount of movability of the pair of opposing shape edges for each gap of the set of gaps in each design solution.

12. The method of claim 7 further comprising:
specifying a first level of difficulty for a first design solution when the movability of the pair of opposing shape edges for each gap of the first design solution is sufficient to create a threshold distance between the pair of opposing shape edges; and
specifying a second level of difficulty for a second design solution when the movability of the pair of opposing shape edges for each gap of the second design solution is not sufficient to create the threshold distance, wherein the first design solution is categorized as having a lower level of difficulty than the second design solution.

13. A non-transitory machine-readable medium storing a program that when executed by at least one processing unit displays design solutions to odd loops, each loop comprising a plurality of shapes that cannot be printed according to design constraints in a dual patterning printing process for a layer of a circuit design layout, the program comprising sets of instructions for:
identifying an odd loop comprising a set of shapes and a plurality of gaps between opposing edges of neighboring shapes in the odd loop;
for each gap of the plurality of gaps, identifying a movability of the corresponding pair of opposing shape edges, wherein the movability is a distance that the pair of opposing shape edges can be moved apart from each other without violating design constraints;
generating a set of design solutions for the odd loop, each design solution for indicating a set of gaps that can be modified such that the set of shapes of the odd loop can be printed without violating the design constraints;
categorizing the design solutions based on a level of difficulty in applying each design solution to the circuit design layout, wherein the level of difficulty is based on the movability of the pair of opposing shape edges for each gap in the set of gaps of each design solution; and
displaying a visual indication for each design solution based on the category of the design solution.

14. The non-transitory machine-readable medium of claim 13, wherein the movability of the pair of opposing shape edges includes a distance that the shapes comprising the opposing shape edges can be moved away from each other without moving any other shape.

15. The non-transitory machine-readable medium of claim 13, wherein the movability of a pair of opposing shape edges includes a distance that each shape edge of the pair of opposing shape edges can be moved without moving the shape edge's shape and without violating a design constraint.

16. The non-transitory machine-readable medium of claim 13, wherein the visual indication is different for different categories of design solutions.

17. The non-transitory machine-readable medium of claim 13, wherein the visual indication indicates an amount of movability of the pair of opposing shape edges for each gap of the set of gaps in each design solution.

18. The non-transitory machine-readable medium of claim 13, wherein the program further comprises sets of instructions for:
specifying a first level of difficulty for a first design solution when the movability of the pair of opposing shape edges for each gap of the first design solution is sufficient to create a threshold distance between the pair of opposing shape edges; and
specifying a second level of difficulty for a second design solution when the movability of the pair of opposing shape edges for each gap of the second design solution is not sufficient to create the threshold distance, wherein the first design solution is categorized as having a lower level of difficulty than the second design solution.

* * * * *